(12) United States Patent
Augusto et al.

(10) Patent No.: US 7,518,540 B2
(45) Date of Patent: Apr. 14, 2009

(54) MULTI-MODE ADC AND ITS APPLICATION TO CMOS IMAGE SENSORS

(75) Inventors: Carlos J. R. P. Augusto, San Jose, CA (US); Pedro N. C. Diniz, Cerritos, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 12/000,049

(22) Filed: Dec. 7, 2007

(65) Prior Publication Data

US 2008/0150782 A1    Jun. 26, 2008

Related U.S. Application Data

(63) Continuation-in-part of application No. 11/418,119, filed on May 5, 2006, now Pat. No. 7,319,423, which is a continuation-in-part of application No. 10/522,805, filed as application No. PCT/EP03/08642 on Jul. 31, 2003, now Pat. No. 7,068,206.

(60) Provisional application No. 60/400,178, filed on Jul. 31, 2002.

(51) Int. Cl.
    *H03M 1/12*      (2006.01)

(52) U.S. Cl. .................. 341/155; 341/118; 341/120; 341/158

(58) Field of Classification Search .............. 341/155
See application file for complete search history.

(56) References Cited

U.S. PATENT DOCUMENTS

| | | | |
|---|---|---|---|
| 5,479,103 A | 12/1995 | Grant et al. | |
| 5,729,232 A | 3/1998 | Fujimori | |
| 5,748,134 A | 5/1998 | Wilkinson | |
| 5,841,310 A | 11/1998 | Kalthoff et al. | |
| 5,877,715 A * | 3/1999 | Gowda et al. | 341/122 |
| 5,920,274 A * | 7/1999 | Gowda et al. | 341/155 |
| 6,124,819 A | 9/2000 | Zhou et al. | |
| 6,340,945 B1 | 1/2002 | Hauptmann et al. | |
| 6,344,877 B1 * | 2/2002 | Gowda et al. | 348/245 |
| 6,366,231 B1 | 4/2002 | Harrison et al. | |
| 6,448,911 B1 | 9/2002 | Somayajula | |
| 6,720,896 B2 * | 4/2004 | Semmler et al. | 341/120 |
| 6,731,232 B1 * | 5/2004 | Kearney | 341/163 |
| 6,839,011 B1 | 1/2005 | Hong | |
| 6,963,300 B1 | 11/2005 | Lee | |
| 6,972,705 B1 | 12/2005 | Fei et al. | |

FOREIGN PATENT DOCUMENTS

GB      2 319 127      5/1998

* cited by examiner

*Primary Examiner*—Khai M Nguyen
(74) *Attorney, Agent, or Firm*—Young & Thompson

(57) ABSTRACT

An analog-to-digital converter apparatus for analog source signals of one polarity, includes one comparator formed from transistors, a block of digitally addressable voltage sources to set a reference voltage of the comparator, an asynchronous n-bit digital counter, a block of digitally addressable voltage sources to set the potential to be applied to the signal source, a digital control unit, a block storing the calibration data for an input capacitor of the comparator, and a base-2 multiplier block, being interconnected by lines, including a line connecting the input analog signal to the drain of a pass transistor, a line connecting the block of voltage sources to be connected to the signal source, a line connecting the digital control unit to transistor gates, and a line carrying the signal Vref from the block of digitally addressed voltage sources to the comparator.

16 Claims, 13 Drawing Sheets

US 7,518,540 B2

MULTI-MODE ADC AND ITS APPLICATION TO CMOS IMAGE SENSORS

The present application is a continuation-in-part (CIP) of U.S. patent application Ser. No. 11/418,119 filed May 5, 2005, now U.S. Pat. No. 7,319,423, which is a CIP of U.S. patent application Ser. No. 10/522,805 filed Aug. 19, 2005, now U.S. Pat. No. 7,068,206, which is a 371 of PCT/EP2003/008642 filed Jul. 31, 2003, which claims benefit of U.S. provisional application 60/400,178 filed Jul. 31, 2002.

FIELD OF THE INVENTION

The present invention relates to analog-to-digital conversion (ADC) of electrical signals in general, including the digitization of signals produced by pixels in image sensors. It also relates to the "acquisition and transfer circuitry" associated with CMOS-based image sensors comprising a matrix of avalanche pixels. Said circuitry was conceived to complement an "Avalanche Pixel", consisting of at least one avalanche photo-diode (APD) and at least one transistor, the row-select transistor (RS).

BACKGROUND OF THE INVENTION

Co-pending application Ser. No. 11/418,119 now U.S. Pat. No. 7,319,423 describes a new implementation of the methodology introduced in U.S. Pat. No. 7,068,206, resulting in more compact circuitry, capable of operating in multiple modes. The versatility of the new implementation of the ADC was applied to CMOS image sensors comprising a matrix with avalanche pixels, resulting in novel capabilities for image sensing and formation.

The present invention describes new variations for the implementation of the ADC, and associated devices for its application as column-parallel A-to-D circuitry of image sensors, that was introduced in co-pending application Ser. No. 11/418,119 now U.S. Pat. No. 7,319,423. The present invention introduces additional configurations for column-parallel circuitry, matrix controller, peripheral circuitry, and overall system architecture of CMOS image sensors, resulting in novel capabilities for image sensing and formation, as well as power generation from operating the image sensors as pixelated solar cells. In addition, new configurations of the ADC circuitry are also suitable for direct RF digitization.

SUMMARY OF THE INVENTION

A first object of the present invention is a new implementation of the quantization methodology for analog signals of one polarity, comprising one comparator 211 plus transistors T1 & T10, a block of digitally addressable voltage sources 213 to set the reference voltage (Vref) of the comparator 211, asynchronous n-bit digital counter 214, a block of digitally addressable voltage sources 215 to set the potential to be applied to the signal source, a digital control unit 216, a block 217 storing the calibration data for the input capacitor (Cref) of the comparator 211, a base-2 multiplier block 218, or an arithmetic table (not shown in the figures), a block of digitally addressable voltage sources 215, comprising transistors T7A through T7D, from which a voltage source will be selected to be connected to line 224, and a block of digitally addressable voltage sources (280), comprising transistors T8A through T8D, from which a voltage source will be selected to be connected to line 281.

The ADC 239 further comprises the following connecting lines or branches:

1. Line 221 connects the source signal to the drain of pass transistor T1;
2. Line 224 connects the source of T1 to the source of T3, and to the block of voltage sources 215 to be connected to the drain of T7A through T7D;
3. Line 283 connects the digital control unit 216 to the gates of T2, T3 and T4;
4. Line 284 connects the digital control unit 216 to the gate of T1;
5. Line 222 carries the signal Vref from the block of digitally addressed voltage sources 213 to the source of transistor T2 of the comparator 211;
6. Line 226 connects the digital control unit 216 to the gate of T10; line 225 connects the output of the comparator 211 to the digital control unit 216 and the source of T10;
7. A group of lines 227 connect the digital control unit 216 to the gates of the pass transistors in block of digitally addressable voltage sources 115 to set the potential to be applied to the signal source;
8. Group of lines 232 connect the digital control unit 216 to the gates of the pass transistors in the block of digitally addressable voltage sources 213 to set the signal Vref for the source of transistor T2 inside the comparator 211;
9. One or several lines 233 connect the output of the asynchronous n-bit digital counter 214 to the digital control unit 216;
10. One line 236 connects the digital control unit 216 to the asynchronous n-bit digital counter 214, to provide a "Reset" signal;
11. One line 235 connects the digital control unit 216 to the asynchronous n-bit digital counter 214, to provide an "Enable" signal;
12. One line 234 connects the digital control unit 216 to the input of the asynchronous n-bit digital counter 214, to provide said input with either the output signal 225 of the comparator 211, or an oscillating signal, such as that provided by a "ring oscillator" 237, through line 327;
13. One or several lines 228 connect the digital control unit 216 to the block 217 storing the calibration data for the input capacitor (Cref) of the comparator 211;
14. One or several lines 229 connect the digital control unit to the 216 to the base-2 multiplier 218;
15. One or several lines 230 connect the block 217 storing the calibration data for the capacitor Cref, to the base-2 multiplier 218;
16. A group of lines 231 provides access to the output of the base-2 multiplier 218, that is, to the binary value corresponding to the analog input signal;
17. A group of lines 227, allow the digital control unit 216 to select which voltage source, i.e., which transistor T7A through T7D inside block 215, will be connected to line 224;
18. A group of lines 282, allow the digital control unit 216 to select which voltage source, i.e., which transistor T8A through T8D inside block 280, will be connected to line 281.

A second object of the present invention is a method of analog to digital conversion using the ADC of the first object of the present invention, operating in a "charge-to-frequency" or "charge-subtraction" mode, in which the input capacitor Cref of the comparator 211 is used to subtract a set of charges from the signal source, and the asynchronous n-bit digital counter 214 records how many sets of charges are subtracted, the method comprising the steps of:

1. At time T=0, the following conditions exist:
   1A. Capacitor Cref has been pre-loaded with the desired Vref value.
   1B. The digital counter 214 has been reset to zero.
   1C. The signal source is OFF (not shown in Figures).

1D. T1 is ON.
1E. T2 & T4 are OFF.
1E. T3 is ON.
1F. T7 is OFF, & all T8s are OFF.
2. Start quantization process
2A. Turn ON the signal source by activating transistor T1 via line 284 and T3 via line 283.
2B. If/when the charge in the signal source is larger than the pre-loaded value into the Cref, there will be a transition (for example from "Low" to "High") at the output 225 of the comparator 211, which will increase the value in the digital counter 214, and turn T1 OFF, through the connecting lines 225 and 223.
2C. While T1 is turned OFF, T3 remains ON, and Cref is discharged through line 224 and T7. When this happens, there is another transition at the output 225 of the comparator 211 (for example from "High" to "Low").
2D. The transition from "High" to "Low" at the output 225 of the comparator 211, triggers the digital control 216 to pre-charge the capacitor Cref by switching ON momentarily transistors T2 and T4 while transistors T3 is OFF.
2E. Following this pre-charging of the Cref capacitor the digital control block 216 turns ON T1 via the line 284 and turns the transistor T3 ON via line 283 while switching OFF transistors T7, T2 and T4, thereby exposing the Cref capacitor of the comparator 211 block to the pixel column signal (line 221).
2F. Steps C through E effectively "locally" reset the comparator 211, and complete a full cycle of counting a packet of charge with the "Charge-Subtraction" method.
2G. When the charge in signal source is smaller than the value pre-loaded to the Cref capacitor, there will not be any more transitions at the output of the comparator 211, and T1 will not be switched OFF anymore.
3. Switch OFF signal source.
4. Transfer the base-2 binary value from the digital counter 214 to a circuitry external to the ADC, such as a "data table".
5. Repeat steps 2, 3, & 4, for any further quantization processes of source signal.

A third object of the present invention is a method of analog to digital conversion using the ADC of the first object of the present invention, operating in a "voltage-to-time" or "voltage extrapolation" mode, in which the input capacitor Cref of the comparator 211 is exposed to the source signal, and from its partial charging an extrapolation is made about the actual value of the source signal, the method comprising the steps of:
1. At time T=0, the following conditions exist:
1A. Capacitor Cref has been pre-loaded with the desirable voltage using one of the T9s.
1B. The digital counter 214 has been reset to zero.
1C. The signal source is OFF.
1D. T1 is ON & T10 is OFF.
1E. T2 is OFF & T3 is ON.
1F. T7 if OFF, and all T8s are OFF
2. Start quantization process
2A. Turn ON the T8 connected to the largest voltage for linear gain, and simultaneously turn ON one of the T7 transistors, for example the one connected to the zero volts (GND) voltage source.
2B. Simultaneously turn ON the source signal, start the digital counters 214, and start counting time. Time is counted by the digital counter 214 when the digital control unit connects to the input of said counter 214, the output of a "ring oscillator", and at the same time disconnects the output 225 of the comparator 211 from the input of the digital counter 214.
2C. When the digital control unit 216 detects a transition at the output 225 of the comparator 211, it stops the digital counter 214, which registered the time interval Tref that it took for the voltage V(t) across the capacitor Cref reached the reference voltage Vref.
2D. Is Tref (or equivalently Vref) too small?
If YES, go to 2E.
In this case the current is too large, and the quantization procedure should be repeated with a larger value of Vref, until Tref is within a pre-defined range of digital values of the counter. However, if Vref is already taken to its maximum value, without Tref reaching the ideal interval, the quantization of the current can be repeated after selecting a T8 with a smaller voltage supply.
If NO, go to 4 (below).
2E. Turn ON the T8 connected to the immediately smaller voltage supply. For example, if the current T8 transistor that is ON is T8A, this steps selected transistor T8B as the next T8 transistor.
2F. Repeat 2B, 2C and 2D until Tref (or equivalently Vref) is no longer too small.
2G. If after quantizing the current with every single T8, Tref is still not in the ideal range, change Vref to a new value, and repeat steps 2A through 2G.
3. Switch OFF the signal source.
4. Transfer the base-2 binary value from the digital counter 114 and the Cref capacitor calibration data 217 into a "Base-2 Multiplier" 218. The product of the processing done at the "Base-2 Multiplier" 218 is then transferred to a circuitry external to the ADC, such as a "data table".
5. Repeat steps 2A through 2D for any further quantization processes of source signal.

A fourth object of the present invention is a method of signal (current or voltage) edge or pulse detection, using the ADC of the first object of the present invention, operating in a "voltage-to-time" or "voltage extrapolation" mode, in which the input capacitor Cref of the comparator 211 is exposed to the source signal, and from its partial charging a signal (current or voltage) edge or pulse is detected for timing purposes, the method comprising the steps of:
1. At time T=0, the following conditions exist:
1A. Capacitor Cref has been pre-loaded with the desirable voltage using one of the T9s.
1B. The signal source is OFF.
1C. T1 is ON & T10 is OFF.
1D. T2 is OFF & T3 is ON.
1E. T7 if OFF, and all T8s are OFF.
2. Start edge/pulse detection
2A. The digital counter 214 is reset to zero.
2B. Turn ON the T8 connected to the voltage supply with which the signal source will have a non-linear behavior, and simultaneously turn ON one of the T7 transistors, for example the one connected to the zero volts (GND) voltage source.
2C. Simultaneously do:
Turn ON signal source,
Trigger external excitation, for example, voltage pulse, or light pulse (flash),
Start the digital counter 214 to count time,
2D. When the digital control unit 216 detects a transition at the output 225 of the comparator 211, it stops the digital counter 214. The digital counter 214 register the time interval it took between the triggering of the external excitation and the detection of an edge/pulse by the ADC.
2E. A pre-defined time interval sets the allowed time to "wait" for response to the external excitation, and if at the end of that time no edge/pulse has been detected, then the digital control unit 216 orders the counter to stop.

3. Turn OFF signal source
4. Transfer the base-2 binary value of the digital counter 214 to a circuitry external to the ADC, such as a "data table".
5. Repeat steps 2A through 4 for any further quantization processes of source signal.

A fifth object of the present invention is a mode of operation of the column-parallel A-to-D circuitry, in which photo-current produced by pixels, in an imaging matrix, is directed away from A-to-D conversion circuitry into other circuitry, suitable for voltage conversion and/or energy storage, the mode of operation comprising the steps of:

1. In block 239, turn OFF transistor T1, all transistors T8 of block 280, all transistors T7 of block 215. They all remain "OFF" while the system operates as a solar cell.
2. Turning "ON" all row-select transistors (RS) transistors in the pixel matrix 240.
3. Turning "ON" transistor T11 and transistor T12 in block 300, which will remain "ON" while the system operates as a solar cell, thus allowing photo-current to flow through lines 302, 303, 306, 307, into block 305.

A sixth object of the present invention is a mode of operation of the column-parallel A-to-D circuitry, in which two column of pixels, in an imaging matrix, are connected in series for the collection of photo-current, thereby adding the open circuit voltage, with said photo-current being directed away from A-to-D conversion circuitry into other circuitry, suitable for voltage conversion and/or energy storage, the mode of operation comprising the steps of:

1. In block 239, turn OFF transistor T1, all transistors T8 of block 280, all transistors T7 of block 215. They all remain "OFF" while the system operates as a solar cell.
2. Turning "ON" all row-select transistors (RS) transistors in the pixel matrix 240.
3. Turning "ON" transistor T11, T12 and transistor T14 in block 304, which will remain "ON" while the system operates as a solar cell, thus allowing photo-current to flow through lines 302, 303, 306, 307, into block 305.

A seventh object of the present invention is a method of analog to digital conversion using the ADC of the first object of the present invention, in which the mode of operation can be software-configured in real-time, between "Charge-Subtraction", "Voltage-Extrapolation", "Voltage Extrapolation for Edge/Pulse Detection", and for Photo-Current collection for power generation (Solar Cell operation), of the second, third, fourth, fifth, and sixth objects of the present invention, depending on the conditions of the analog input signal (source signal) itself, or on some external control signal, through the digital control unit 216.

An eighth object of the present invention is an image sensing system shown in FIG. 14, in which the ADC of the first object of the present invention is used as column-parallel A-to-D circuitry 243 and 244 of a CMOS image sensor comprising a matrix of avalanche pixels 240, each comprising one avalanche photo-diode (APD) and one Row-Select Transistor (RS) transistor, fabricated according to U.S. Pat. No. 6,943, 051 B2, and with layouts such as those described in WO 2006/010615, photo-current power conversion and/or storage unit 305, a matrix controller 241 as well as a logic unit comprising a run length encoder 242, table 245 with Cref calibration data for ADCs of blocks 243 & 244, one or more base-2 multiplier 246, a timing table 247 for 3D imaging, and a number "n" of bit planes 248a to 248n, to be used in the Sub-Frame method of image formation.

BRIEF DESCRIPTION OF THE DRAWING FIGURES

DESCRIPTION OF THE INVENTION

The "Description of the Invention" is organized in four main sections, as follows:

Section #1 cites all prior art relevant to the present disclosure.

Section #2 describes the new ADC implementation of the current invention, and discusses the differences with respect to the implementation disclosed in co-pending application Ser. No. 11/418,119 now U.S. Pat. No. 7,319,423.

Section #3 describes the new implementation of the ADC as "column-parallel A-to-D circuitry" of a CMOS Image Sensor (CIS). In particular it discusses the new modes of operation of said circuitry, including a solar cell mode, in which the electrical signals generated in the pixel matrix can be used to generate electrical power.

Section #4 provides more details on the digital circuitry that controls the ADC and blocks of "column-parallel A-to-D circuitry".

Section #1: Relevant Prior Art

Figure 1:
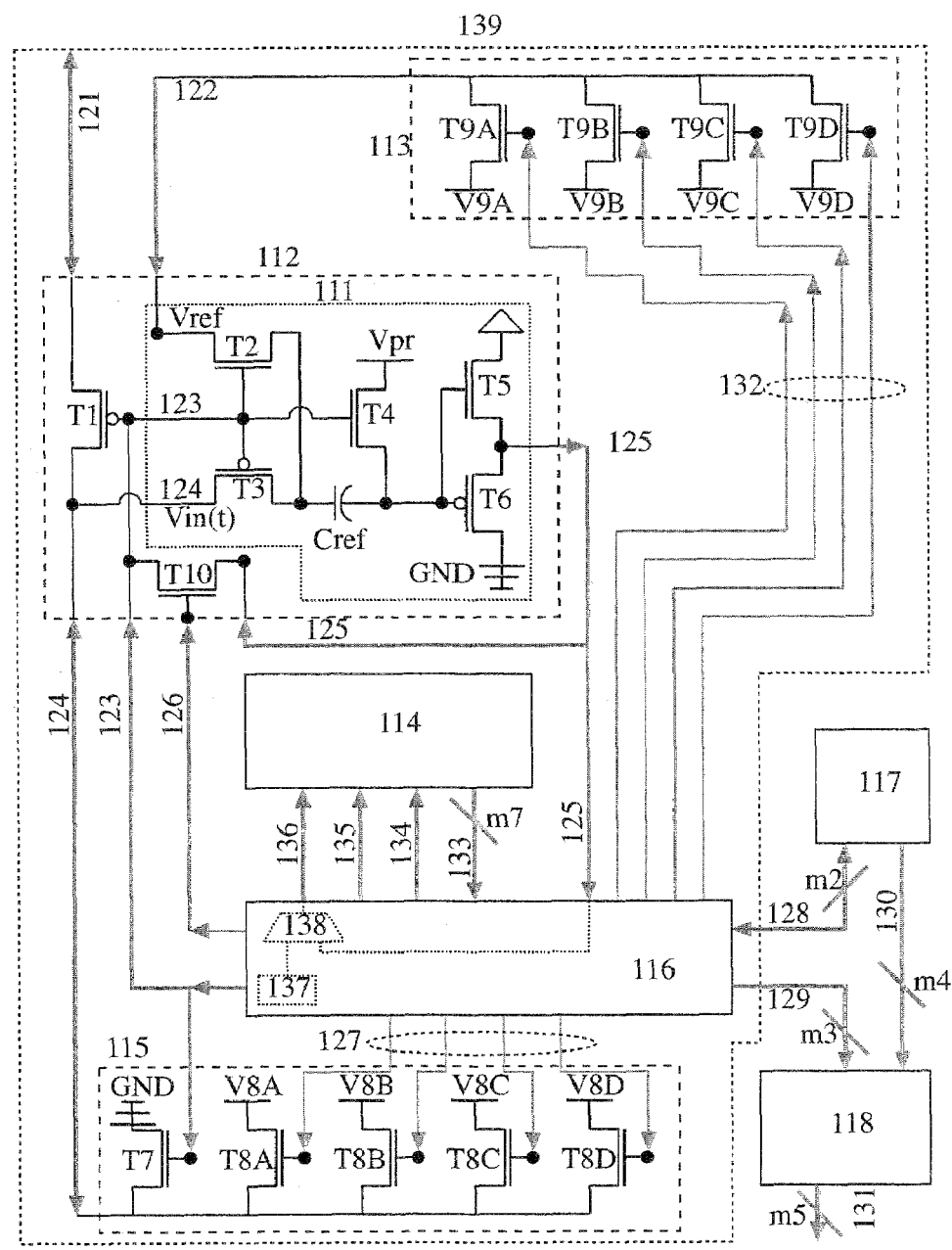
FIG. 1 (Prior Art) is a schematic circuit diagram of ADC from co-pending application Ser. No. 11/418,119.
Figure 2:
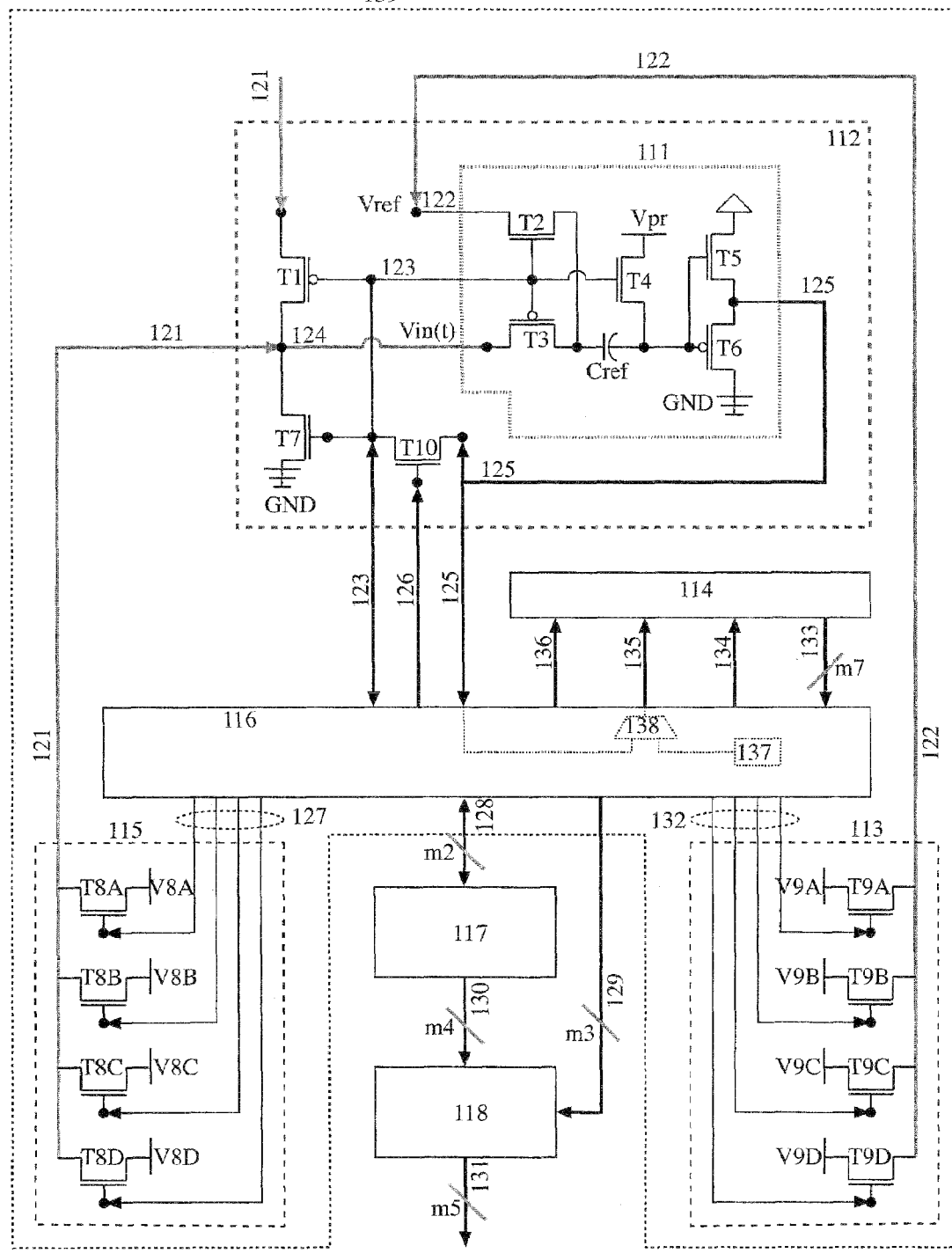
FIG. 2 (Prior Art) is a re-arranged schematic circuit diagram of ADC from co-pending application Ser. No. 11/418, 119.

All the relevant prior art for the present application comes from co-pending application Ser. No. 11/418,119. The present application introduces modifications to some circuit diagrams and new blocks of circuitry, which in turn add new functionality. The following recalls the most relevant aspects of the prior art:

FIG. 1 shows Prior Art, FIG. 2 from co-pending application Ser. No. 11/418,119 now U.S. Pat. No. 7,319,423. In particular it shows a schematic diagram of an implementation of the ADC for signals of a single polarity. The block of circuitry designated as "139", which excludes blocks "117" and "118", was devised to be suitable as a block of "column-parallel A-to-D" circuitry in image sensors.

FIG. 2 shows Prior Art, FIG. 2 from co-pending application Ser. No. 11/418,119, now U.S. Pat. No. 7,319,423 in which the exact same circuit has been geometrically re-arranged.

Figure 3:
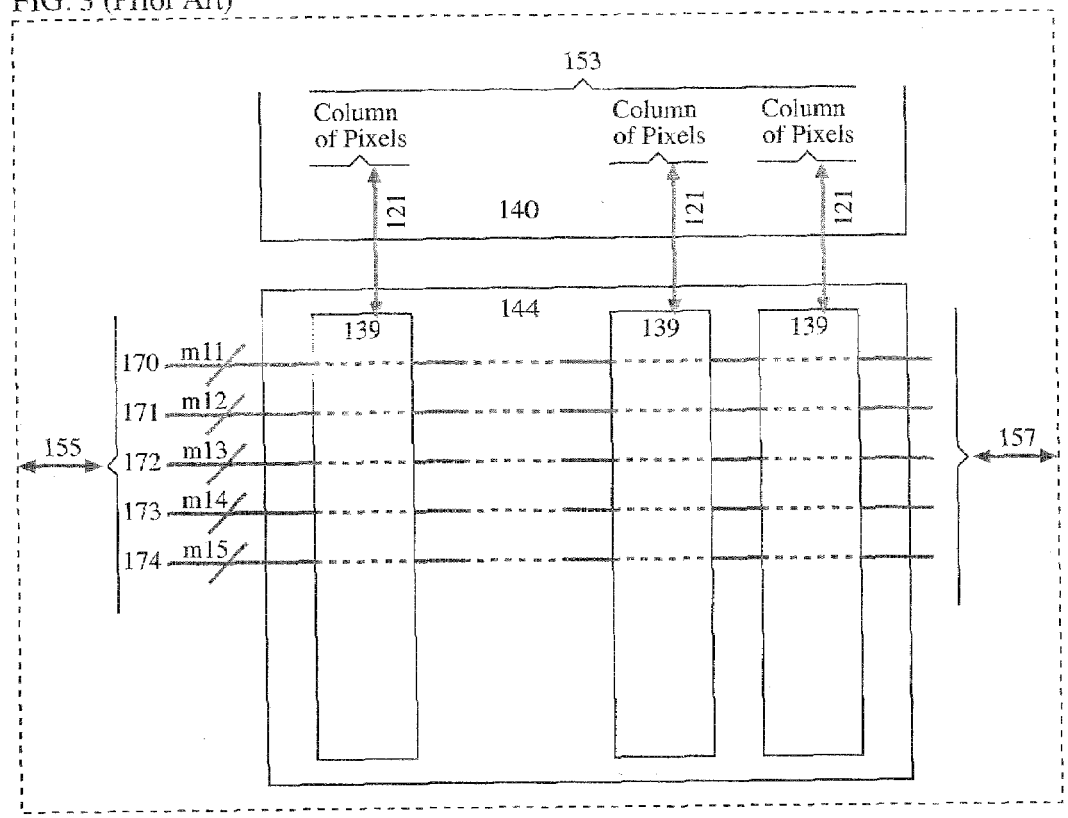
FIG. 3 (Prior Art) is a schematic block diagram of the connections between a pixel matrix and the column circuitry.
Figure 5:
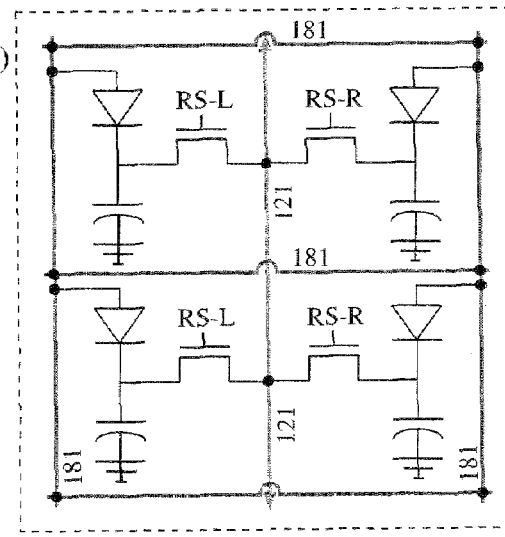
FIG. 5 (Prior Art) is a schematic diagram of a four-pixel cell showing connection lines consistent with the circuit of FIGS. 1, 2, 3.

FIG. 3 also shows Prior Art, FIG. 5 from co-pending application Ser. No. 11/418,119, now U.S. Pat. No. 7,319,423 and in particular it shows how a multitude of blocs of "column-parallel A-to-D" circuitry, identified as "139" in FIG. 2, can be linked to a corresponding multitude of columns of pixels, part of a pixel matrix 140, through interconnect lines "121". It also shows a multitude of signal and control lines, "170" through "174" links the multitude of blocks "139" to other circuitry elements at the periphery of the pixel matrix.

Figure 4:
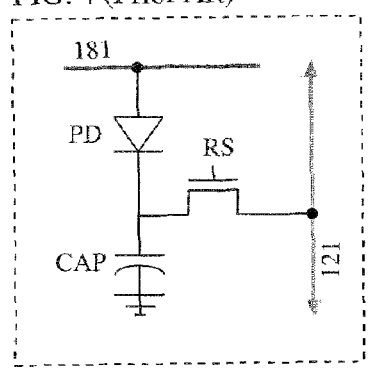
FIG. 4 (Prior Art) is a schematic diagram of a single pixel cell showing connection lines consistent with the circuit of FIGS. 1, 2, 3.

FIG. 4 also shows Prior Art from co-pending application Ser. No. 11/418,119, now U.S. Pat. No. 7,319,423 and in particular it shows how column lines 121 connect to exemplary pixel cells composed of a Row-Select (RS) transistor, a photo-diode (PD), and a capacitor (CAP). One Source/Drain terminal of the RS transistor is connected to line 121, while the other S/D terminal connects to a node that is share by the bottom electrode of the PD and the top electrode of the CAP. The bottom electrode of the CAP device is connected to the "ground", while the top electrode of PD is connected to line 181 that supplies the suitable electrical potential for different modes of operation of the PD, including avalanche operation.

FIG. 5 also shows Prior Art from co-pending application Ser. No. 11/418,119, now U.S. Pat. No. 7,319,423 and in particular it shows how 4 pixels can be grouped to form a cell. In this cell, two columns of pixels share a single column line 121, with each pixel in said columns having a different row-select line, thus leading to two row-select lines, RS-L and RS-R, for each row of pixels.

Figure 6:
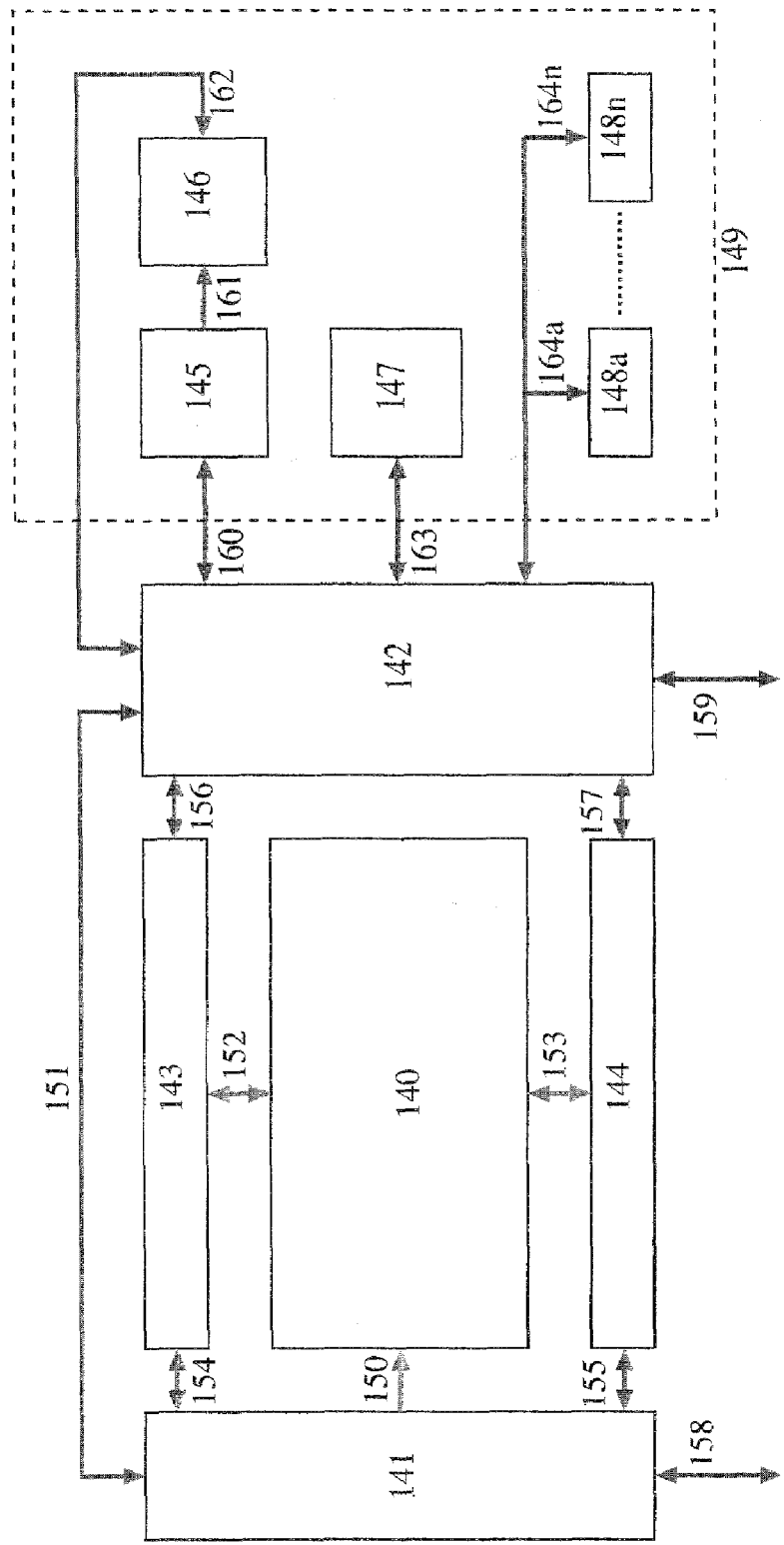
FIG. 6 (Prior Art) is a schematic block diagram of an image sensing system.

FIG. 6 also shows Prior Art from co-pending application Ser. No. 11/418,119, now U.S. Pat. No. 7,319,423 and in particular it shows an exemplary system architecture for an image sensor, comprising a pixel matrix 140, column circuitry blocks 143 and 144, each comprising a multitude of column-parallel A-to-D circuitry blocks 139 as shown in FIG. 3 and described in FIG. 2, as well as several other blocks of circuitry necessary to enable the multiple modes of operation of the ADC, the multiple modes of operation of the pixels, the multiple modes of the readout process, and the resulting multitude of combined operations as described in co-pending application Ser. No. 11/418,119 now U.S. Pat. No. 7,319,423.

Section #2: New ADC for Analog Signals of a Single Polarity

Section #2 describes the application of the ADC implementation as the "column-parallel A-to-D circuitry" of a CMOS Image Sensor (CIS). The manner in which the ADC, as part of the "column-parallel A-to-D" circuitry interacts with the pixel matrix, is different from the one disclosed in co-pending application Ser. No. 11/418,119, now U.S. Pat. No. 7,319,423 and will be described in detail.

Figure 7:
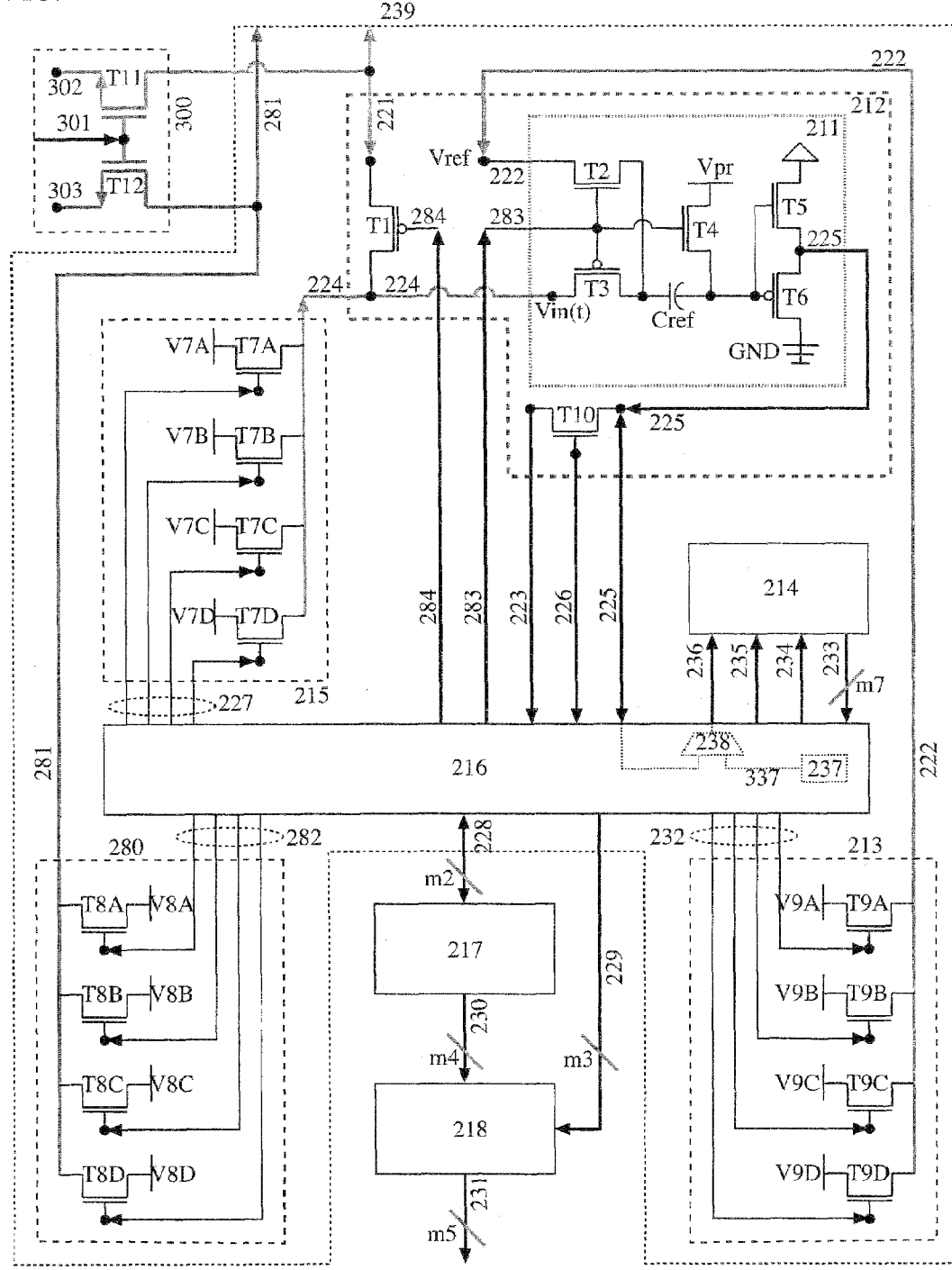
FIG. 7 is a schematic circuit diagram of one implementation of the new ADC.
Figure 8:
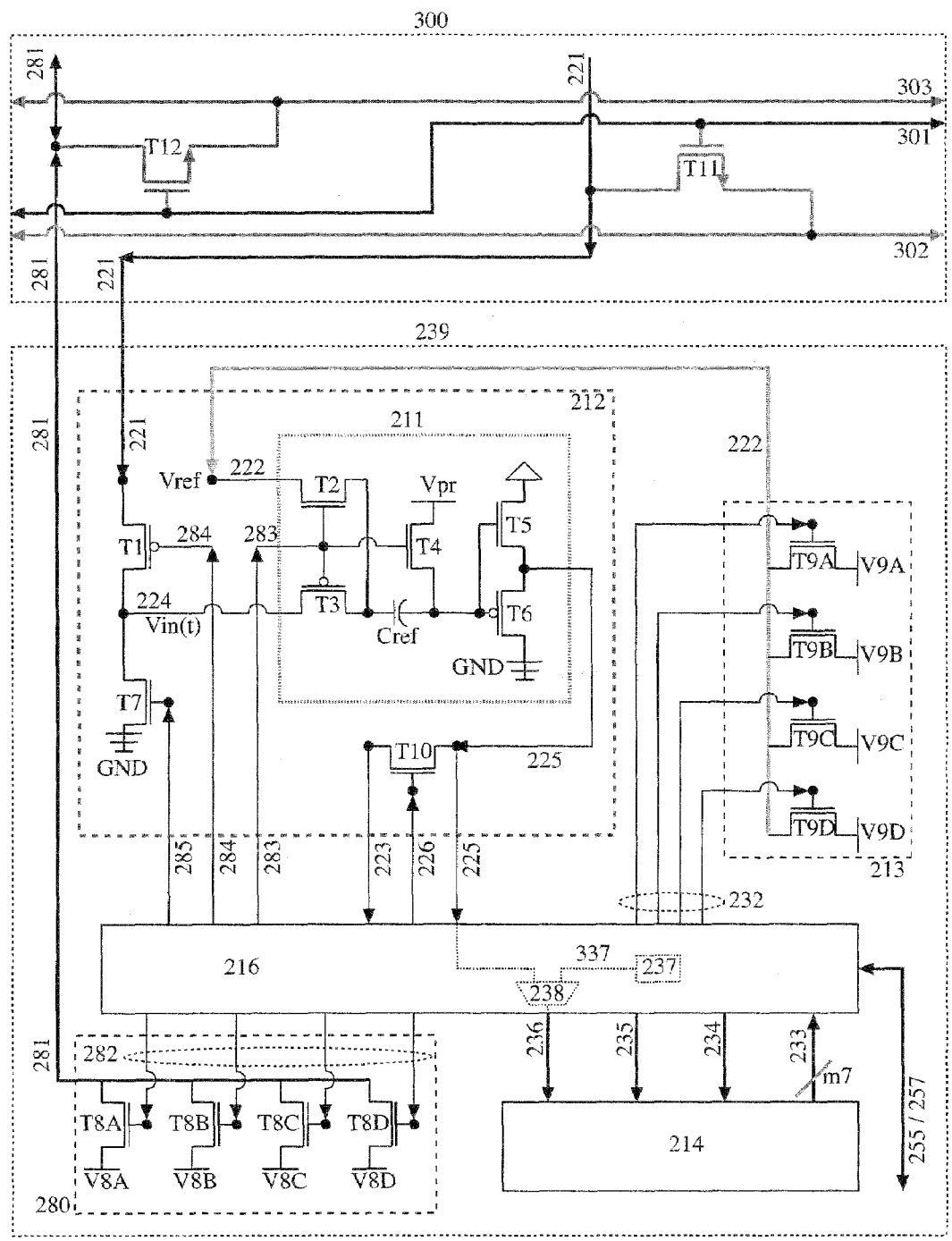
FIG. 8 is a schematic circuit diagram of another implementation of the new ADC.

FIG. 7 shows the new configuration of the ADC as part of a column-parallel A-to-D block of circuitry for a CIS. FIG. 8 shows a circuit diagram similar to that of FIG. 7, with a different geometric arrangement, and in which instead of transistors T7A, T7B, T7C, and T7D, there is a single T7 transistor, also independently addressed by the digital control unit 216.

While there is similarity with the configuration shown in FIG. 2 (Prior Art), the following important differences should be noted:

(1) Interaction with a column of pixels is now performed with two separate lines, 221 and new line 281, versus a single line (121 in FIG. 2).
(2) Voltage sources T7A, T7B, T7C, and T7D, are connected to line 221, and are independently addressed by the logic control unit 216. They replace the single transistor T7 of FIG. 2.
(3) Voltage sources T8A, T8B, T8C, and T8D, are connected to line 281, and no longer connected to line 221.
(4) New block 300, consisting of transistors T11 and T12.

One fundamental novelty is the new line 281, which carries a well-defined voltage to a column of pixels. This voltage is pre-selected within block 239, and may be changed through digital addressing of one of the voltage sources identified as V8A, V8B, V8C, or V8D, forming the block 215. Naturally a larger number of voltage sources could be considered. The voltage carried by line 281 is directly applied to the top electrode of the photo-diodes. This configuration allows for a wider range voltage amplitude and polarity than the implementation described in co-pending application Ser. No. 11/418,119, in which line 121 carried a positive voltage to be applied at the bottom terminal of the photo-diode, through the RS transistor. With line 281, the voltage can be applied on a column-by-column basis, without involving the RS transistors. The voltage carried by line 281 may be of negative polarity and of larger amplitude than that possible to handle by the RS transistors.

Block 300 is new and provides two pass transistors connected to lines 221 and 281, at points that are topologically at the interface of block 239.

Figure 9:
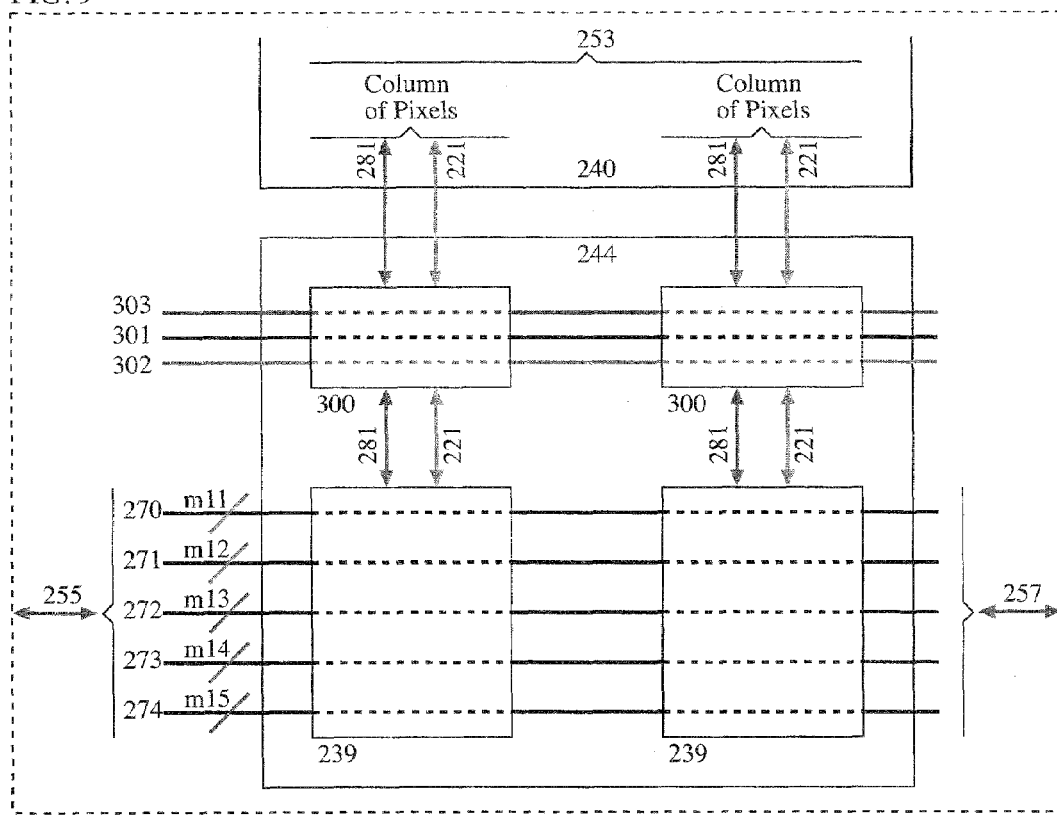
FIG. 9 is a schematic block diagram showing the connections between a pixel matrix and the new column circuitry.

The integration of the new block 239 into a multitude of column-parallel A-to-D blocks aligned with a pixel matrix is described in FIG. 9, where it shows how a multitude of blocks of "column-parallel A-to-D" circuitry, identified as "239" in FIG. 8, can be linked to a corresponding multitude of columns of pixels, part of a pixel matrix 240, through interconnect lines 221 and 281. It also shows a multitude of signal and control lines, 270 through 274, linking multiple blocks 239 to other blocks of circuitry at the periphery of the pixel matrix.

Figure 10:
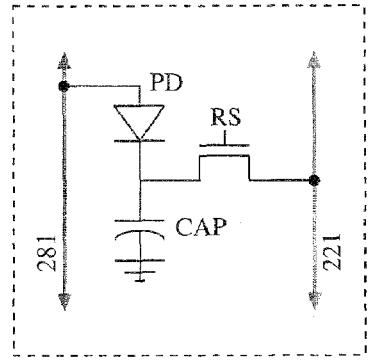
FIG. 10 is a schematic diagram of a single pixel cell showing connection lines consistent with the circuit of FIGS. 7 and 8.

In FIG. 10 it is shown how column lines 221 and 281 connect blocks 239 to exemplary pixel cells composed of a Row-Select (RS) transistor, a photo-diode (PD), and a capacitor (CAP). One Source/Drain (S/D) terminal of the RS transistor is connected to line 221, while the other S/D terminal connects to a node that is shared by the bottom electrode of the PD and the top electrode of the "CAP". The bottom electrode of the CAP device is connected to the "ground", while the top electrode of PD is connected to line 281 that supplies the suitable electrical potential for different modes of operation of the PD, including avalanche operation.

Figure 11:
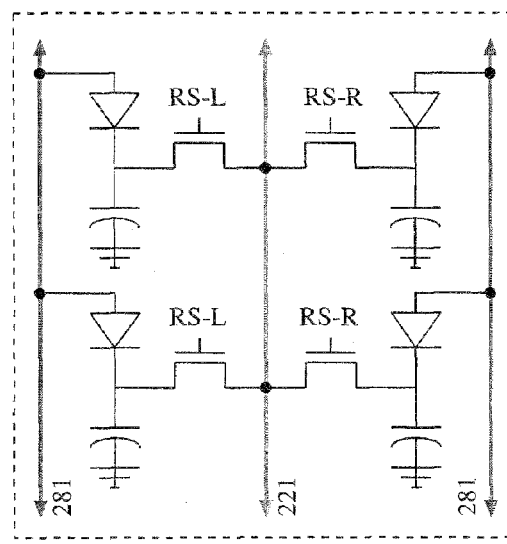
FIG. 11 is a schematic diagram of a four-pixel cell showing connection lines consistent with the circuit of FIGS. 7 and 8.

FIG. 11 shows how 4 pixels can be grouped to form a cell. In this particular cell, two columns of pixels share a single column line 221, while lines 281 may be kept separate for each column. Naturally, the two lines 281 for the two columns of pixels in this cell could also be connected to each other, or in any other arrangement, depending on the specific details of the pixel cell, such as those described in WO2006010615: "Layouts for the Monolithic Integration of CMOS and Deposited Photonic Active Layers".

In the particular pixel cell depicted in FIG. 11, the pixels in the two columns (same row) sharing the same column line 221, have different row select lines, RS-L and RS-R. Time-multiplexing of RS-L and RS-R row-select lines allows for pixels of the same row, located on column "L" and "R" respectively, to individually access column line 221. With this cell configuration it is also possible to allow the simultaneous access, to column line 221, of all four pixels, thereby adding the signals of the four pixels, while decreasing the resolution by a factor of four. The details regarding modes of operation are discussed in the next section.

The purpose of block 300, comprising pass transistors T11 and T12 is to enable the redirecting of the current that would otherwise flow from the pixel matrix 240, into the A-to-D conversion process normally performed by block 239. Standard image sensors such as CCDs and Active Pixel Sensor (APS) CIS cannot operate in a photo-current mode, but other pixel technologies, such as the one described in U.S. Pat. No. 6,943,051, U.S. Pat. No. 7,265,006, and U.S. patent application Ser. No. 11/781,544, can operate in such a mode. The integration and functionality of block 300, as part of an image sensor, in exemplified in one configuration in FIG. 12, and in a different configuration (block 304) in FIG. 13.

Figure 12:
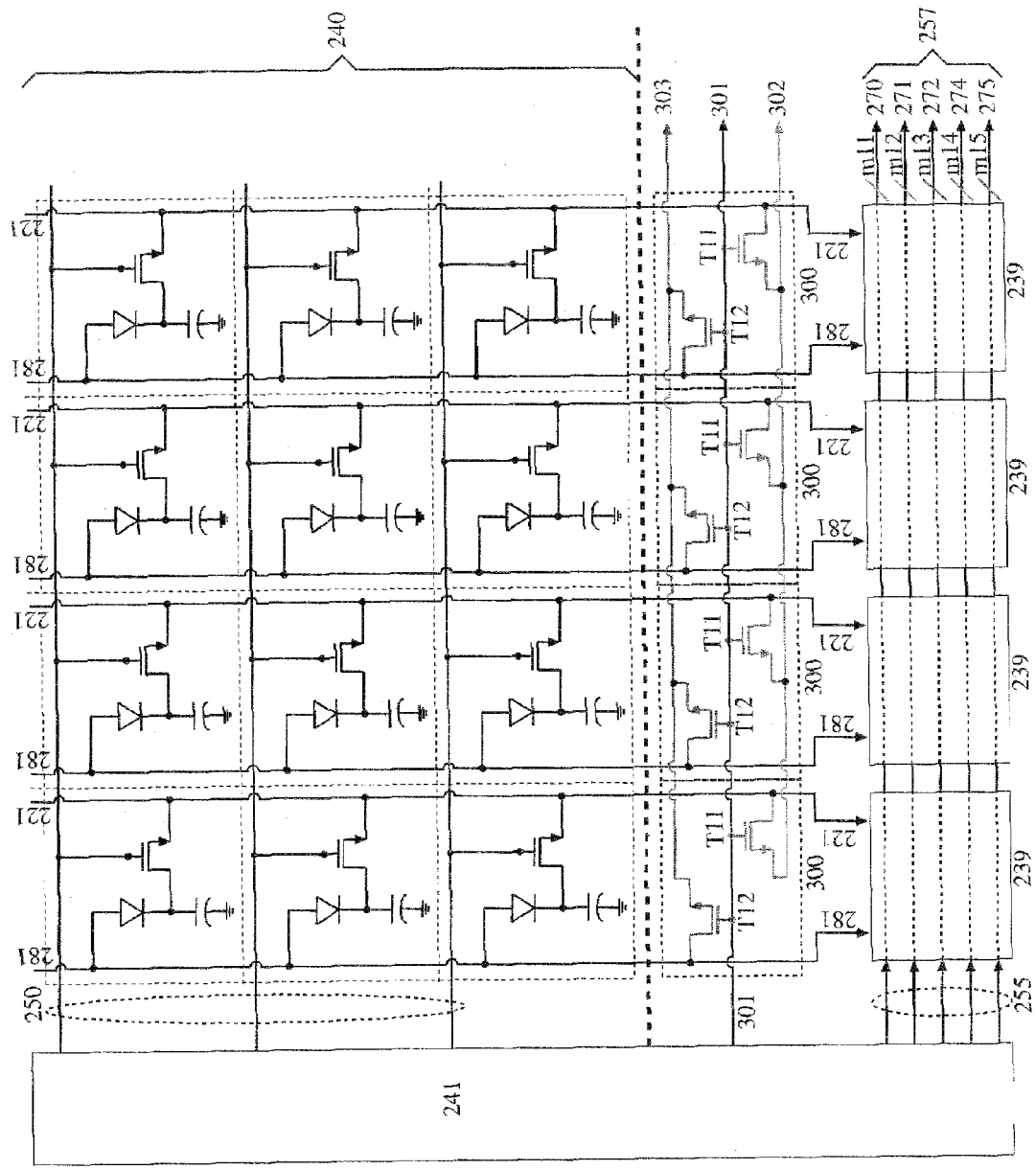
FIG. 12 is a schematic diagram showing connections between a pixel matrix, matrix controller, column-parallel A-to-D converters, and one configuration for column-parallel circuitry to enable solar cell operation.

FIG. 12 shows a schematic representation of a portion of a pixel matrix 240, a digital control block 241 that commands row-selection and also interacts, via line 280 and the set of lines 255, with the column-parallel A-to-D blocks of circuitry 239. It also explicitly shows blocks 300 and lines 302 and 303. In this arrangement, one column of pixels interacts with one block 300 and one block 239.

Figure 13:
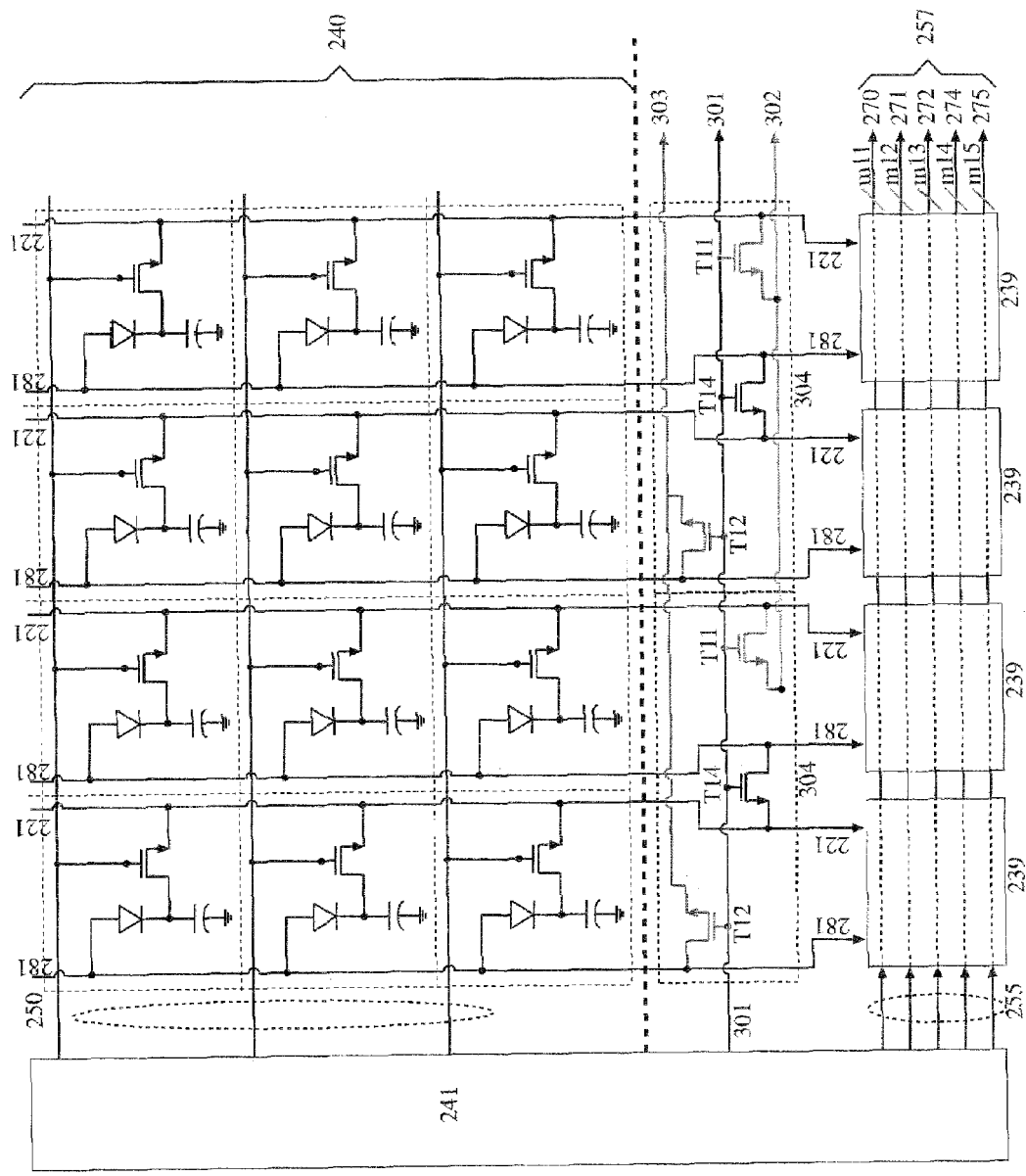
FIG. 13 is a schematic diagram showing connections between a pixel matrix, matrix controller, column-parallel A-to-D converters, and another configuration for column-parallel circuitry to enable solar cell operation.

FIG. 13 shows a schematic representation of a portion of a pixel matrix 240, a digital control block 241 that commands row-selection and also interacts, via line 280 and the set of lines 255, with the column-parallel A-to-D blocks of circuitry 239. It also explicitly shows blocks 304 and lines 302 and 303. In this arrangement, two columns of pixels interact with a single block 304, derived from a block 300, modified to allow the series connection of two sets of lines 221 and 281, when transistor T14 is turned ON. When transistor T14 is turned OFF, one set of lines 221 and 281 from one column are isolated from the set of lines 221 and 281 from the adjacent column, and thus allow normal operation of imaging modes, independently for each column, using the respective 239 blocks.

Figure 14:
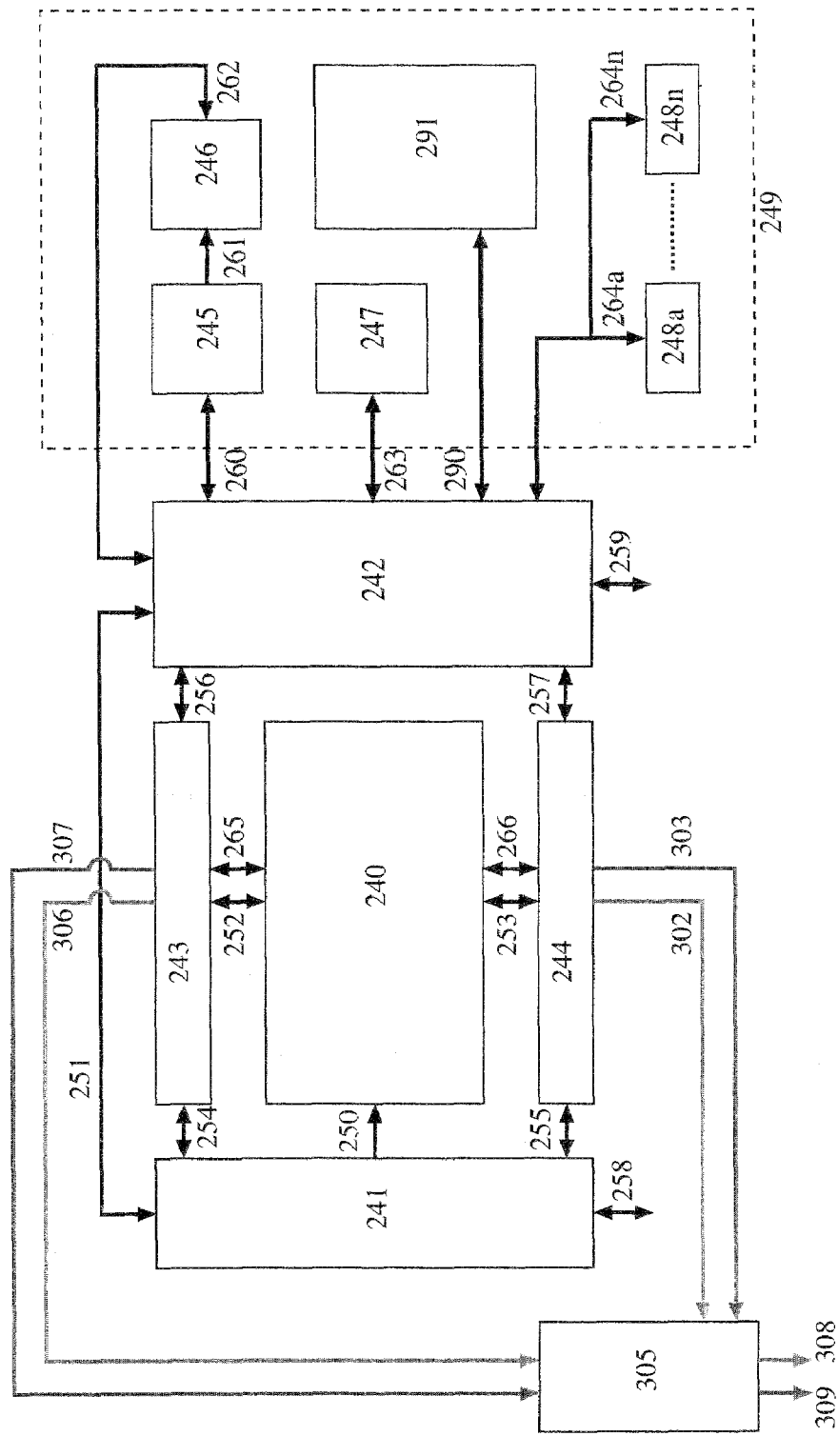
FIG. 14 is a schematic block diagram of an image sensing system with solar operation capability.

FIG. 14 shows an exemplary system architecture for an image sensor, similar to that of FIG. 6, but with the addition of new blocks of circuitry such as block 305, and new connections, such as those represented by lines 302, 303, 306 and 307, and by lines 308, 309. These new additions enable the operation of the image sensors as a pixilated solar cell, in which the photo-current generated by the pixel matrix is directed through lines 302, 303, 306, 307, to block 305, for voltage conversion to levels suitable to charge a battery.

Figure 15:
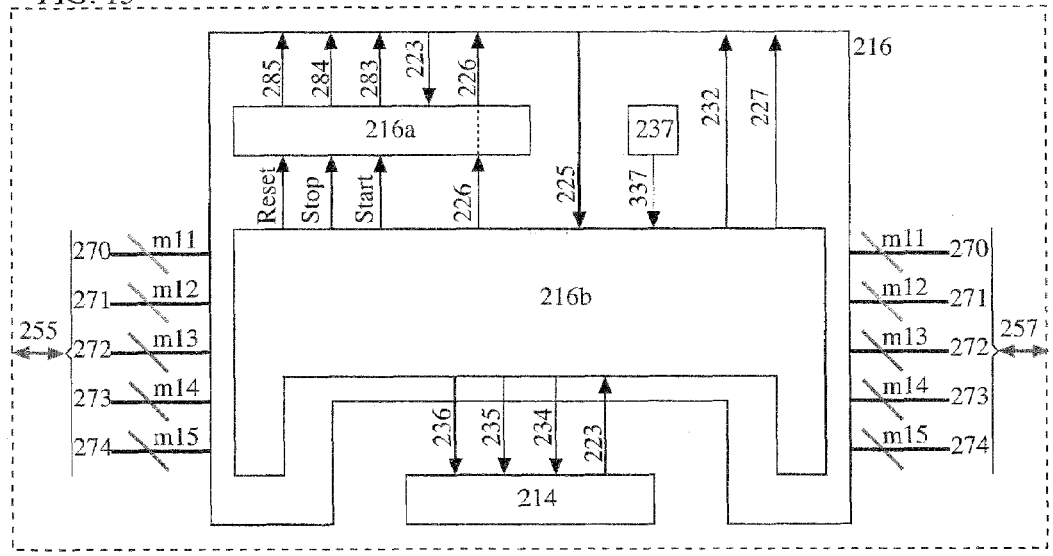
FIG. 15 is a schematic diagram of the column-parallel A-to-D converter controller block (216b) showing the connection between the basic A-to-D controller block (216a), the Ring-Oscilator block (237) and the digital binary counter block (214).

FIG. 15 shows an exemplary implementation of the block 216. Internally, this block is composed of three main blocks, respectively blocks 216a, 216b and 237. Block 237 is a simple ring-oscillator used to generate a very high-frequency clock signal, to be used in the voltage-to-time conversion mode in which the digital binary counter in block 214 (shown in FIG. 17) is used as a stopwatch.

Block 214 can be implemented as a simple ripple counter with an asynchronous reset (236) and an enable signal (235). The input line used as clock in this counter is indicated as the clock (234) and its output with parity m16 is denoted by the set of lines designated by 233.

Block 216a (shown in FIG. 16) is the basic ADC controller block that directly controls the ADC to engage in its various internal steps when performing the Analog-to-Digital conversion. This block can be implemented as a set of logic gates (g1 through g3) and digital logic inverters (i1 through i4) and a non-inverter buffer (i5). The purpose of these logic gates is to generate a sequence of pulses at the output lines of this block, respectively, 285, 284 and 283, that force the circuitry in block 212 in FIG. 7 to cycle through three modes. These modes, respectively "reset", "pre-charge" and "comparison" will generate at the output of the comparator (225) a positive pulse that will trigger another "reset/pre-charge/comparison" cycle. Alternatively, this cycle can be initiated by pulsing the "Start" control line for this block 216a.

Finally, block 216b (shown in FIG. 18) is the ADC controller that can interpret commands from the periphery of the pixel array to activate all the column-parallel A-to-D blocks. This circuitry implements a simple finite-state-machine (FSM) that determines when the basic ADC control logic of block 216a should be activated. In addition, this block directs the output (225) of the comparator (211) of the ADC to the digital binary counter in block 214 (shown in FIG. 17), as well as the management of the counter via its "reset" and "enable" lines.

DETAILED DESCRIPTION OF THE OPERATION OF THE NEW IMPLEMENTATION OF THE ADC

An exemplary new implementation of the ADC, for signals of just one polarity, is shown in the schematic circuit diagram of FIG. 7, in which the labels m1, m2, m3, etc, refer to possible multiple lines in parallel.

The new implementation impacts modes of operation already described co-pending application Ser. No. 11/418,119, resulting in slightly different settings and commands to achieve certain operations. For this reason, in the following, the modes already described in said co-pending application will be listed with the suitable modifications.

It should be noted that the schematic circuit diagram of FIG. 8, is identical to that of FIG. 7, except for having a single transistor T7, instead of block 280 with four transistors (T7A, T7B, T7C, and T7D), and consequently a single line 285 replaces the group of lines 282, to connect the digital control unit. Therefore the operation of the ADC, described for the diagram of FIG. 7, is also applicable to the diagram of FIG. 8.

The ADC 239 consists of several circuitry blocks and lines or branches connecting them.

The ADC 239 comprises the following circuitry blocks: one comparator 211 plus transistors T1 & T10, a block of digitally addressable voltage sources 213 to set the reference voltage (Vref) of the comparator 211, asynchronous n-bit digital counter 214, a block of digitally addressable voltage sources 215 to set the potential to be applied to the signal source, a digital control unit 216, a block 217 storing the calibration data for the input capacitor (Cref) of the comparator 211, a base-2 multiplier block 218, or an arithmetic table (not show in the figures) and a block of addressable voltage sources 280, comprising transistors T7A through T7D, from which it will be selected a voltage source to be connected to line 224.

The ADC 239 further comprises the following connecting lines or branches:

1. Line 221 connects the source signal to the drain of pass transistor T1;
2. Line 224 connects the source of T1 to the source of T3, and to the block of voltage sources 280 to be connected to the drain of T7A through T7D;
3. Line 283 connects the digital control unit 216 to the gates of T2, T3 and T4;
4. Line 284 connects the digital unit 216 to the gate of T1;
5. Line 222 carries the signal Vref from the block of digitally addressed voltage sources 213 to the source of transistor T2 of the comparator 211;
6. Line 226 connects the digital control unit 216 to the gate of T10; line 225 connects the output of the comparator 211 to the digital control unit 216 and the source of T10;
7. A group of lines 227 connect the digital control unit 216 to the gates of the pass transistors in block of digitally addressable voltage sources 115 to set the potential to be applied to the signal source;
8. Group of lines 232 connect the digital control unit 216 to the gates of the pass transistors in the block of digitally addressable voltage sources 213 to set the signal Vref for the source of transistor T2 inside the comparator 211;
9. One or several lines 233 connect the output of the asynchronous n-bit digital counter 214 to the digital control unit 216;
10. One line 236 connects the digital control unit 216 to the asynchronous n-bit digital counter 214, to provide a "Reset" signal;
11. One line 235 connects the digital control unit 216 to the asynchronous n-bit digital counter 214, to provide an "Enable" signal;
12. One line 234 connects the digital control unit 216 to the input of the asynchronous n-bit digital counter 214, to provide said input with either the output signal 225 of the comparator 211, or an oscillating signal, such as that provided by a "ring oscillator" 237;
13. One or several lines 228 connect the digital control unit 216 to the block 217 storing the calibration data for the input capacitor (Cref) of the comparator 211;
14. One or several lines 229 connect the digital control unit to the 216 to the base-2 multiplier 218;
15. One or several lines 230 connect the block 217 storing the calibration data for the capacitor Cref, to the base-2 multiplier 218;
16. A group of lines 231 provides access to the output of the base-2 multiplier 218, that is, to the binary value corresponding to the analog input signal.
17. A group of lines 282, allow the digital control unit 216 to select which voltage source, i.e., which transistor T7A through T7D inside block 280, will be connected to line 224.

For certain applications it could be beneficial to have several ADCs sharing a single "Base-2 Multiplier" 218, and/or storing the Cref calibration data in tables external to the ADCs. Therefore, for certain applications, such as the one described below in which the ADC acts as the "column circuitry" of a CMOS image sensor, the block holding the calibration data 217 of the input capacitor (Cref), and the a "Base-2 Multiplier" 218, are external to the ADC, and are considered to be part of the "peripheral circuitry".

The asynchronous n-bit digital counter 214 works in a conventional manner. The key to "multi-mode" operation of the ADC (described below) is the analog block 212, which is able to merge, into a single comparator, the two modes of operation, "Charge-Subtraction" and "Voltage-Extrapolation", already described in co-pending application Ser. No. 11/418,119. The ability to operate in one or the other mode is essentially determined by the signals sent by the digital controller unit 216, to the gates of pass-transistors T1 and T10, as explained in detail below.

It should be noted that several transistors in block 212, in particular T1 and T3, could be designed and operated with a dynamic threshold voltage ("Dynamic Vt"), thereby minimizing the effect of these transistors on the flow of charge from/to the signal source and through the quantization process.

The "Voltage-Extrapolation" method requires either an "arithmetic table" (not shown in figures) or a "Base-2 Multiplier" 218, and a "calibration value" 217 of the input capacitor of the comparator (which are not necessary for the "Charge-Subtraction" method). The "Base-2 Multiplier" (or an "arithmetic table") does not have to be part of the ADC, and for certain applications these elements can process data from several ADCs, as in the example shown in FIG. 14. The fundamental mathematical principles of this mode of operation were described in U.S. Pat. No. 7,068,206, and will not be repeated here.

The following descriptions will use references to transistor devices as labeled in FIG. 7. It should be noted that in FIG. 7 connecting branches 228 and 229 represent multiple lines whose number depends on the number of voltage sources for Vref and for pixels, respectively. The example in FIG. 7 has four (4) voltage sources possible to connect to the signal source, and four (4) voltage sources for Vref. Naturally the number of voltage source for either purpose can be changed according to the needs of a particular application.

As explained in co-pending application Ser. No. 11/418, 119, the "Voltage-Extrapolation" mode of operation involves ratios of time periods or ratios between numbers of oscillations with a well-defined base-time or period. These ratios do not depend on the absolute time period of the oscillations, and for this reason a simple oscillatory circuit, such as a "ring oscillator", can be used. Furthermore, this oscillatory circuit 237 is not driven or related to any of the properties of the input signal. The ring oscillator circuit is assumed to be part of the digital control unit 216. By measuring, and storing the value for the speed of the ring oscillator, it is possible to use absolute time, rather than just using a number of oscillations whose duration is unknown. For applications involving several ADCs, a table can be constructed with all values of the absolute time period of the oscillation of each ring oscillator.

In FIG. 7, the ring oscillator 237 is shown inside the digital control unit 216. These figures also show a qualitative description of how the signal (337) from the ring oscillator 237 can be multiplexed, through 238, with the signal from the output 225 of the comparator 211, before connecting to the input of the digital counter 214. This multiplexing, controlled by logic inside the digital control unit, is necessary to enable the n-bit digital counter to be driven directly and asynchronously by the output 225 of the comparator 211 for the "Charge-Subtraction" mode, and to be driven by the ring oscillator for the "Voltage-Extrapolation" mode of the ADC.

The digital control unit 216 interacts with the digital counter 214 through several lines. Line 234 connects to the input of the asynchronous n-bit digital counter, line 235 carries the "enable" signal to the counter, and line 236 carries the "reset" signal to the counter 214, while the set of multiple lines 233 transfers the value of the counter to the digital control unit 216.

1.1. Common Operation Procedures: Pre-Loading and Calibration of Cref

In the description of the operation of the ADC, two procedures will be commonly mentioned: (1) Pre-loading of Cref, and (2) Calibration of Cref.

(1) Pre-loading of Capacitor Cref is Done by (Refer to FIG. 7):

The digital control unit 216 activates signal 283 in order to:
1A. Turn OFF T3;
1B. Turn ON T2 & T4;
The digital control unit 216 activates signal 284 in order to:
2A. Turn OFF T1;
The digital control unit 216 activates one the signals from line 232 in order to:
1C. Turn ON one of the T9 transistors to selects the Vref voltage;

(2) Calibration of Capacitor Cref (for "Voltage-Extrapolation" Mode) is Done by:

Fixing the input voltage to the expected maximum voltage of input signal, for example 5 Volts, and using another reference voltage, for example 1 Volt, to determine the value of the time constant (commonly known as the product of the resistive load R and the capacitor load C, or RC). For any capacitor, this value has to be determined and stored in a register only once. After this procedure the value is available for any subsequent use in calculations.

1.2. ADC Operating in "Charge-Subtraction" Mode

Referring to FIG. 7, a "Local Reset" can be implemented by directly linking the gate of T1 (284) (through line 223) to the output of the Comparator 225. This can be done with digital control unit 216 having T10 turned ON while the ADC operates in this mode.

1. At time T=0, the Following Conditions Exist:
   1A. Capacitor Cref has been pre-loaded with the desired Vref value.
   1B. The digital counter 214 has been reset to zero.
   1C. The signal source is OFF (not shown in Figures).
   1D. T1 is ON.
   1E. T2 & T4 are OFF.
   1E. T3 is ON.
   1F. T7 is OFF, & all T8s are OFF.

2. Start Quantization Process
   2A. Turn ON the signal source by activating transistor T1 via line 284 and T3 via line 283.
   2B. If/when the charge in the signal source is larger than the pre-loaded value into the Cref, there will be a transition (for example from "Low" to "High") at the output 225 of the comparator 211, which will increase the value in the digital counter 214, and turn T1 OFF, through the connecting lines 225 and 223.
   2C. While T1 is turned OFF, T3 remains ON, and Cref is discharged through line 224 and T7. When this happens, there is another transition at the output 225 of the comparator 211 (for example from "High" to "Low").
   2D. The transition from "High" to "Low" at the output 225 of the comparator 211, triggers the digital control 216 to precharge the capacitor Cref by switching ON momentarily transistors T2 and T4 while transistors T3 is OFF.
   2E. Following this pre-charging of the Cref capacitor the digital control block 216 turns ON T1 via the line 284 and turns the transistor T30N via line 283 while switching OFF transistors T7, T2 and T4, thereby exposing the Cref capacitor of the comparator 211 block to the pixel column signal (line 221).
   2F. Steps C through E effectively "locally" reset the comparator 211, and finish a full cycle of counting a packet of charge with the "Charge-Subtraction" method.
   2G. When the charge in signal source is smaller than the value pre-loaded to the Cref capacitor, there will not be any more transitions at the output of the comparator 211, and T1 will not be switched OFF anymore.
3. Switch OFF signal source.
4. Transfer the base-2 binary value from the digital counter 214 to a circuitry external to the ADC, such as a "data table".
5. Repeat steps 2, 3, & 4, for any further quantization processes of source signal.

1.3. ADC Operating in "Voltage-Extrapolation" mode

This mode of the ADC will be applied to measure charge flux (current) rather than a finite amount of charge. For sake of simplicity it will be assumed that during the interval of one measurement, the signal (current) does not change appreciably. In this mode, T1 is always "ON" during the time interval for one quantization process, and transistor T7 acts as a resistive load, which under a constant current, provides a constant potential drop (voltage). In this mode the gate of T1 is not connected to the output 225 of the comparator 211, as the pass transistor T10 is kept always OFF by the signal carried by line 226 from the digital control unit 216.

The value of Vref can be selected by the digital control unit 216 turning ON, through lines 232, one of the T9 transistors (T9A, or T9B, or T9C, or T9D), to optimize different parameters, for example, to increase the speed of conversion, or to minimize the error of conversion. With appropriate digital circuitry to monitor the digital value of the input signal, it is possible to dynamically adjust in real time the magnitude of Vref. This can be used to optimize the total bandwidth available as a function of the evolution of the input signal.

The current and the measured voltage drop across T1 can be scaled up and down, by selecting different voltage sources to connect to the signal source. The selection of the voltage by the digital control unit 216 is done by turning ON, through lines 227, the T8 that is connected to the desired voltage source (T8A, or T8B, or T8C, or T8D).

The selection of Vref and voltage source (T8A, or T8B, or T8C, or T8D), can be adjusted in real time to obtain the optimal range of voltage drop across T1 and the optimal time interval Tref measured by the digital counter 214, used to count time.

The absence of transitions at the output of the comparator 211 could be an indication that the value of Vref is too large, and that a new quantization process with a smaller Vref should be attempted. If there are no transitions even when Vref is set at its minimum value, which is dependent on the noise level, then the digital counter 214 counting time is not stopped, and the digital control unit 216 allows the capacitor Cref to remain exposed to the input signal (Vin) until Vin becomes larger then Vref. Therefore it can be said that the quantization operation is asynchronous.

1. At time T=0, the following conditions exist:
   1A. Capacitor Cref has been pre-loaded with the desirable voltage using one of the T9s.
   1B. The digital counter 214 has been reset to zero.
   1C. The signal source is OFF.
   1D. T1 is ON & T10 is OFF.
   1E. T2 is OFF & T3 is ON.
   1F. T7 if OFF, and all T8s are OFF 2. Start Quantization Process
2A. Turn ON the T8 connected to the largest voltage for linear gain.
2B. Simultaneously turn ON the source signal, start the digital counters 214, and start counting time. Time is counted by the digital counter 214 when the digital control unit connects to the input of said counter 214, the output of a "ring oscillator", and at the same time disconnects the output 225 of the comparator 211 from the input of the digital counter 214.
2C. When the digital control unit 216 detects a transition at the output 225 of the comparator 211, it stops the digital counter 214, which registered the time interval Tref that it took for the voltage V(t) across the capacitor Cref reached the reference voltage Vref.
2D. Is Tref (or equivalently Vref) too small?
If YES, go to 2E.
In this case the current is too large, and the quantization procedure should be repeated with a larger value of Vref, until Tref is within a pre-defined range of digital values of the counter. However, if Vref is already taken to its maximum value, without Tref reaching the ideal interval, the quantization of the current can be repeated after selecting a T8 with a smaller voltage supply.
If NO, go to 4 (below).
2E. Turn ON the T8 connected to the immediately smaller voltage supply. For example, if the current T8 transistor that is ON is T8A, this steps selected transistor T8B as the next T8 transistor.
2F. Repeat 2B, 2C and 2D until Tref (or equivalently Vref) is no longer too small.
2G. If after quantizing the current with every single T8, Tref is still not in the ideal range, change Vref to a new value, and repeat steps 2A through 2G.
3. Switch OFF the signal source.
4. Transfer the base-2 binary value from the digital counter 114 and the Cref capacitor calibration data 217 into a "Base-2 Multiplier" 218. The product of the processing done at the "Base-2 Multiplier" 218 is then transferred to a circuitry external to the ADC, such as a "data table".
5. Repeat steps 2A through 2D for any further quantization processes of source signal.

1.4. ADC Operating in "Voltage-Extrapolation" Mode for Detection of Current or Voltage Edge/Pulse In addition to using the "Charge-Subtraction" and "Voltage-Extrapolation" modes of operation to quantize the amplitude of a signal, the "Voltage-Extrapolation" mode can also be used to detect current or voltage edges or pulses, which in turn can be used for timing purposes.

The following describes how the ADC of the present invention can be operated for detection of a current or voltage edge/pulse. The interaction between the digital control unit 216, the analog block 212, and the digital counter 214 are different from its use in the previously described "Voltage-Extrapolation" mode. The digital counter 214 will be used to count time, as explained in subsection 1.3.

1. At time T=0 the Following Conditions Exist:
1A. Capacitor Cref has been pre-loaded with the desirable voltage using one of the T9s.
1B. The signal source is OFF.
1C. T1 is ON & T10 is OFF.
1D. T2 is OFF & T3 is ON.
1E. T7 if OFF, and all T8s are OFF.

2. Start Edge/Pulse Detection
2A. The digital counter 214 is reset to zero.
2B. Turn ON the T8 connected to the voltage supply with which the signal source will have a non-linear behavior.
2C. Simultaneously do:
Turn ON signal source,
Trigger external excitation, for example, voltage pulse, or light pulse (flash),
Start the digital counter 214 to count time,
2D. When the digital control unit 216 detects a transition at the output 225 of the comparator 211, it stops the digital counter 214. The digital counter 214 records the time interval it took between the triggering of the external excitation and the detection of an edge/pulse by the ADC.
2E. A pre-defined time interval sets the allowed time to "wait" for response to the external excitation, and if at the end of that time no edge/pulse has been detected, then the digital control unit 216 orders the counter to stop.
3. Turn OFF signal source
4. Transfer the base-2 binary value of the digital counter 214 to a circuitry external to the ADC, such as a "data table".
5. Repeat steps 2A through 4 for any further quantization processes of source signal.

Section #3: New Implementation of "Column-Parallel A-to-D Circuitry" for Image Sensors The new implementation introduces a completely new mode of operation, in which an image sensor with suitable pixel technology, can be operated as a pixelated solar cell.

The modifications made to the ADC block 239 of FIG. 7 and FIG. 8, with respect to the ADC block 139 of FIG. 1, impacted certain details of its operation and the exact sequence of steps to achieve the different modes of operation of the ADC, such as "Pre-Loading and Calibration of Cref", "Charge-Subtraction", "Voltage-Extrapolation", and "Voltage-Extrapolation for detection of current or voltage edge/pulse", as already described.

Though the details of the internal operations and interactions with the pixels, are different for the block 139 and blocks 239, the final results are similar, that is, the modes of operation and their characteristics are similar. For this reason, all the functionality based on one mode of operation, or on a combination of several modes of operation, remains available, and is not dependent on the internal details of the ADC (block 139 or 239).

Therefore, all the functionality described in co-pending application Ser. No. 11/418,119, now U.S. Pat. No. 7,319,423 in the chapters and sub-chapter listed below, is applicable to the new subject matter described in FIGS. 7 through 14, and will not be repeated in the present disclosure:

Section #3: ADC as "column circuitry" of an image sensor
3.1. Operation with "Electronic Global Shutter" (EGS)
3.2. Operation with "Electronic Rolling Shutter" for light intensity signals (ERS-1)
3.3. Operation with "Electronic Rolling Shutter" for Edge/Pulse signal detection (ERS-2)
3.4. Operation without a Shutter (Shutter-less Operation)
Section #4: Methods of Image Formation enabled by the new ADC
4.1. Definition of "Full-Frame" Method
4.2. Definition of "Sub-Frame" Method
4.3. Comparison between "Full-Frame" and "Sub-Frame" Methods
4.4. "Diaphragm-less" Imaging
4.5. Special Properties of the Sub-Frame Image Formation Method
4.6. Photo-Current & Shutter-less operation Block 239 can perform all modes that block 139 could, and allows new possibilities, such as the biasing the photo-diodes in matrix 240, one a column-by-column basis. The combination of block 239 with block 300 (or 304) enable the new solar cell operation described below.

FIG. 14 shows a schematic block diagram of the key elements of an exemplary image sensor system. In this block diagram the top 243 and bottom 244 blocks of "column circuitry", are identical, and are each a set of ADCs in parallel, each being connected to a data column line in the pixel matrix 240. There will be as many ADCs as there are data column lines, which may or may not be identical to the number of actual pixel columns, depending on the layout, as exemplified in WO2006010615.

Blocks 240 are 241 are shown connected by a branch 250 with multiple lines, including the digital signals by which the block 241 commands the Row-Select (RS) transistors of pixels inside block 240. Block 240 is also connected to block 243 of column-parallel ADCs through branch 254 with multiple lines, and is also connected to block 244 of column-parallel ADCs through branch 255 with multiple lines. Block 240 has branch 258 with multiple lines, connecting it to external circuitry.

One important difference to note with respect to co-pending application Ser. No. 11/418,119, now U.S. Pat. No. 7,319,423 is that with the modified ADC blocks 239, the bias applied to the top electrode of the avalanche photo-diodes (APDs), can be selected on a column-by-column basis (through lines 281). This is a relevant modification because when the matrix controller selects a particular row, each pixel in that row communicates with the respective column-parallel circuitry. For the time interval during which a row of pixels is selected, it is as if the block of column-parallel circuitry belonged to the pixel (of the selected row) in the respective column.

This allows each column of photo-diodes to be under different bias conditions and therefore can have different avalanche gains. This capability is particularly relevant for a sensor matrix operated in the "Electronic Rolling Shutter", in which the matrix controller selects one row of pixels at a time, for purposes of signal acquisition and readout. This capability means that during the acquisition of a given image, each pixel can have a different sensitivity level, set by the avalanche gain, which is controlled by the applied voltage across the APD.

In an analogy with film image acquisition, it is as if one could have a roll of film in which the sensitivity of each pixel (rated in ASA or ISO) could be different and adjusted in real time, according to the intensity of light impinging on each pixel.

In co-pending application Ser. No. 11/418,119, now U.S. Pat. No. 7,319,423 this capability was implemented by varying the applied bias at the bottom electrode of the APD. The voltage could be selected from a block of "voltage sources" inside the column circuitry. In the implementation of the current disclosure, each column of pixels has an independent line 281 contacting the top electrode of the APDs in that column of pixels, applying a voltage selected from a set of voltage sources (block 215), in a column-by-column fashion.

This solution is superior to the one in co-pending application Ser. No. 11/418,119 now U.S. Pat. No. 7,319,423 because it does not suffer from the potential issues with applying positive voltage to the bottom electrode of the APD through the RS transistor, which might cause problems with electric fields across the gate oxide.

An easy and quick way of resetting the pixels, on a column-by-column fashion or simultaneously to the top electrodes of all photo-diodes in the pixel matrix, is to apply a forward biasing voltage to the top electrode of the APDs, and therefore removing all stored charges at the in-pixel capacitors ("CAP" in FIG. 10).

Block 242 is a logic unit, comprising a "run length encoder", connected to block 241 through branch 251 with multiple lines, connected to block 243 of column ADCs through branch 256 with multiple lines, connected to block 244 of column ADCs through branch 157 with multiple lines, connected to external circuitry through branch 259 with multiple lines.

Block 245 is a table with Cref calibration of all ADCs from blocks 243 and 244, and is connected to block 242 through branch 260 with multiple lines, and block 246 through branch 261 with multiple lines. Block 146 is composed of one or several multiplier base-2, and is connected to block 242 through branch 262 with multiple lines. Block 247 is a table with timing data to be used for 3D imaging and is connected to block 242 through branch 263 with multiple lines. Blocks 248a through 248n comprise bit-planes #1 through #n, to be used for the Sub-Frame Method, and are connected to block 242 through branches 248a to 248n, each with multiple lines.

Block 305 and connecting lines 302, 303, 306 and 307 are new to the current implementation, and are related to the operation of the image sensor matrix as a pixilated solar cell. This will be described in detail in the following.

FIG. 9 schematically shows in details on how the connecting branches 252 and 253, each represent all the data column lines connecting to the ADCs in the top and bottom blocks respectively. Similarly, but not shown in detail in the figures, the connecting branches 250, 251, 254, 255, 256, 257, 258, 259, 260, each represent several connecting lines. It also shows how the blocks 300 are positioned between blocks 239 and columns of pixels. FIG. 12 provides more detail to a particular implementation of blocks 300 and their connections to the vertical lines 221 connecting to the RS transistors in the pixels, and to lines 281 connecting to the photo-diodes. FIG. 13 provides similar detail to another implementation of block 300 (called block 304) in which, through transistor T14, it is possible to establish a series connection between two sets of lines 221 and 281.

New Operation Mode: Pixelated Solar Cell

The purpose of blocks 300 and/or 305 is to allow the redirecting of current generated by the pixels inside the matrix 240, from the ADC blocks 239, through lines 302 and 303, to block 305 (FIG. 14). When the photo-current is so redirected, it will not be quantized, but it will be handled by other types of circuitry, such as voltage converters and battery charge controllers, for storage and/or direct powering of other devices.

The entire image sensor matrix 240 can be operated as a pixilated solar cell, by turning "ON" transistors T11 and T12, while turning "OFF" transistors T1, T8A, T8B, T8C, T8D, the photo-current is redirected away from block 239. For purposes of generating as much electrical power as possible, all RS transistors connected to a given line 221 should be turned "ON", thereby allowing all photo-currents generated by all pixels to be added, in parallel, to the flux flowing through transistor T11 into line 302. Simultaneously, all the current injected, in parallel, into line 281 by all photo-diodes, will low through transistor T12 into line 303.

The currents generated at a column level, and being carried by one set of lines 221 and 281 can be combined into a single current flow, carried by lines 302 and 303. However other arrangements are possible in which the electrical charge carried by one set of lines 221 and 281 could be combined in series with the electrical charge carried by lines 221 and 281 of an adjacent column, thereby increasing the voltage. This possibility will be discussed in more detail at a later point in this document.

FIG. 12 shows a schematic representation of a portion of a pixel matrix 240, a digital control block 241 that commands row-selection and also interacts, via line 280 and the set of lines 255, with the column-parallel A-to-D blocks of circuitry 239. It also explicitly shows blocks 300 and lines 302 and 303. In this arrangement, one column of pixels interacts with one block 300 and one block 239.

FIG. 13 shows a schematic representation of a portion of a pixel matrix 240, a digital control block 241 that commands row-selection and also interacts, via line 280 and the set of lines 255, with the column-parallel A-to-D blocks of circuitry 239. It also explicitly shows blocks 304 and lines 302 and 303. In this arrangement, two columns of pixels interact with a single block 304, derived from a block 300, modified to allow the series connection of two sets of lines 221 and 281, when transistor T14 is turned ON. Transistor 14 is turned ON by the same command line that turns ON transistors T11 and T12.

When transistor T11, T12, and T14 are turned OFF, one set of lines 221 and 281 from one column are isolated from the set of lines 221 and 281 from the adjacent column, and thus the allow normal operation of imaging modes, independently for each column, using the respective 239 blocks.

Referring to FIG. 8 and FIG. 12 or FIG. 13, solar cell operation of the pixel matrix is achieved by:

1. Turning OFF transistor "T1", which remains "OFF" while the system operates as a solar cell.
2. Turning "ON" all row-select transistors (RS) transistors in the pixel matrix.
3. Turning "ON" transistor T11 and transistor T12 in block 300, which will remain "ON" while the system operates as a solar cell. T11 connects to line 221, which connects to the source terminals of all RS transistors of a column, and sends the current to line 302. T12 connects to line 281, which connects to the top terminal of the photo-diodes of the respective column, and sends the current to line 303. The solar cell generated energy is delivered through lines 302 and 303.
4. Lines "302" and "303" connect to circuitry that handles the photo-current to either directly supply power to a load circuit or to store the energy in a storage device.
5. Each column carries the current of all pixels that are connected to it. For operation as a solar cell, columns can be connected in parallel or in series, to optimize performance, that is lines "302" and "303" from each column can be connected in parallel (all lines "302" connected together and all lines "302" connected together) or in series (some lines "302" connected to some lines "303").

Section #4: Digital Control of "Column-Parallel A-to-D" Circuitry

The revised implementation of the controller is depicted in FIG. 15 and consists of four major internal blocks. Block 216a is responsible for directly controlling the column-parallel A-to-D circuitry. Block 237 is a simple ring-oscillator. Block 214 is a digital binary counter. Finally, the central controller, block 216b, orchestrates the operation of all these blocks, and coordinates interactions with external blocks such as the block that controls the activation of each row of pixels in the pixel matrix. The operation and internal composition of each of these blocks, is described in greater detail, whenever appropriate.

Figure 16:
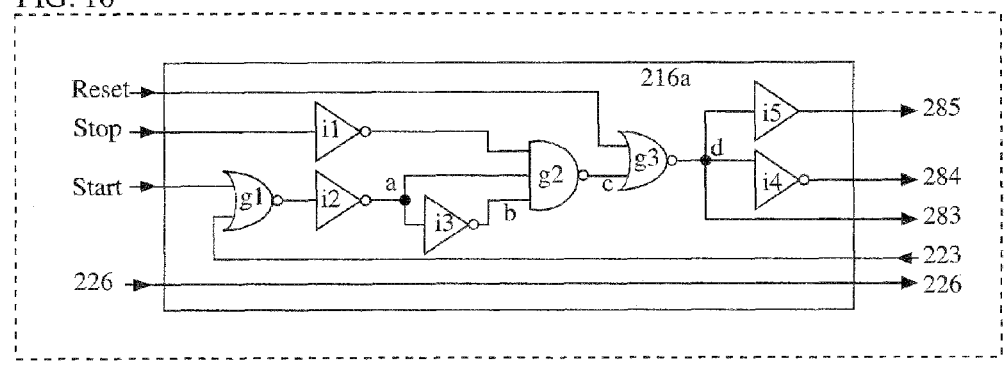
FIG. 16 is a schematic diagram of the basic A-to-D controller block (216a).

The basic column-parallel A-to-D controller block (216a), consists of three logic gates (g1 through g3), four logic inverter gates (i1 through i4), and a single non-inverter buffer (i5), as depicted in FIG. 16. Other than a "Reset" input line it also has a "Start" and a "Stop" input lines. Its outputs are the lines that directly activate transistors in block 212, described in FIG. 8. The basic operation of this block consists in generating a sequence of very short asynchronous pulses, whose width or duration is determined by the propagation delay of the inverters i2 and i3, that will create a sequence of transitory states triggering the three states of operation of block 212, respectively, "reset", "pre-charging" and "comparison". Initially, this block is "jump-started" by having its "Start" input to be pulsed, and thus trigger a sequence of pulses at its output. This sequence will be recreated when the feedback input line 233 (connected to the output of the comparator in block 211 via the line 225 and transistor T10 in FIG. 8.) also pulses. As long as the "Stop" line is not active, the simple controller of block 216a will repeatedly generate pulses in response to a pulse at the output of the comparator circuit in block 211.

Figure 17:
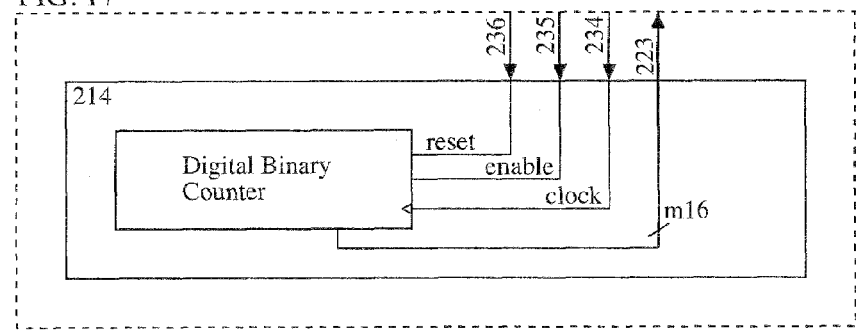
FIG. 17 is a schematic diagram of the digital binary counter block (214).

The pulses generated at the output of the comparator block 211, also feed (under the control of the block 216b to be described below) to the digital binary counter block 214. Counter block 214 can be implemented as a simple ripple-counter, with three input signals and one output signal, as depicted in FIG. 17. This digital counter has a simple asynchronous "Reset" command line (236) and an "Enable" line (235). Block 214 counts the number of times the "clock" input line (234) pulses, and presents the corresponding counter value at its output lines (233) in base-2 representation. Lines (233), whose width can be parameterized (represented by the numeric value "m16") in FIG. 17 indicates therefore the number of binary digits (or bits) of the counter inside block 214. The output lines 233 from each digital binary counter block (214) are connected to the data bus lines (274), as shown in FIG. 19.

Figure 19:
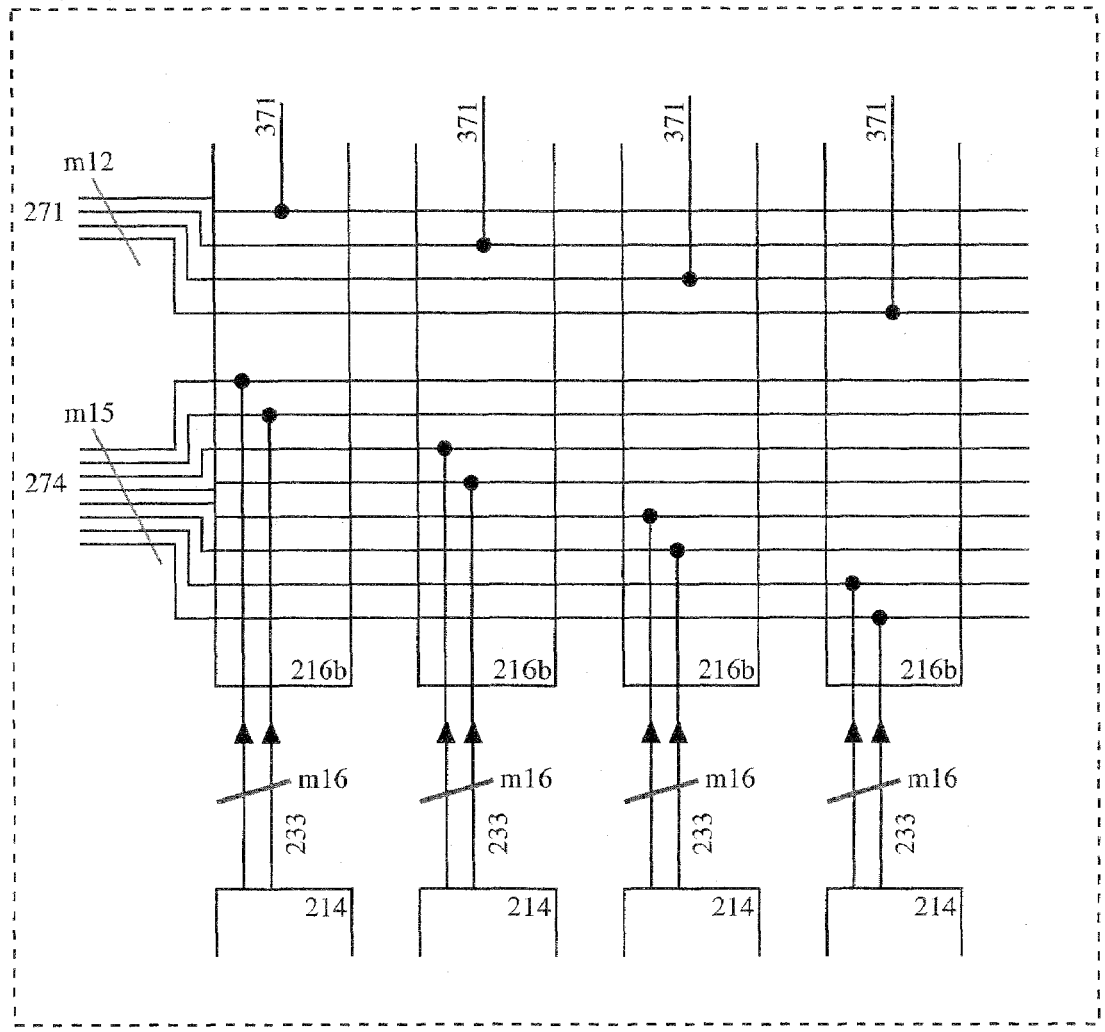
FIG. 19 is a schematic diagram of the connection between the digital binary counter block (214) output lines (233) to the data bus lines (274) and description of the connection between the internal control lines 371 of blocks 216b to the data bus line (271).

FIG. 19 illustrates an example in which the connections of the lines 233 to the bus lines 274, for the specific case of an arrangement with four (4) digital counter blocks (214), each of which with a counter with only 2 binary digits (or bits). In this specific example in FIG. 19, the numeric value of m16 is two (2) and the numeric value of the width (or number of lines) of the data bus (274) is m15 equal to eight (8).

FIG. 19 also depicts the connection between the internal line 371 and the bus line 271. Again, and merely as an example, there are four (4) digital control blocks 216b, each of which outputs its internal 371 line to one of the four (4) lines that comprise the bus line 271. Therefore, in this particular case, the numeric value of m12 is four (4), as there are four (4) distinct 371 lines, each from its own 216b block. In either of these cases, the width of the buses 271 and 274 is directly proportional to the number of 216b and 214 blocks, as the number of each of the latter ones are the same. Given a number K of blocks 216b (and also of K blocks 214), and since the number of bits of the digital binary counter in each block 214 is given by m16, the width of the bus line 271, referred to as m15, must be at least K times m16. Correspondingly the width of the bus line 271, referred to as m12, is given by K times 1, as the width of the line 371 in each 216b block is unitary.

Figure 18:
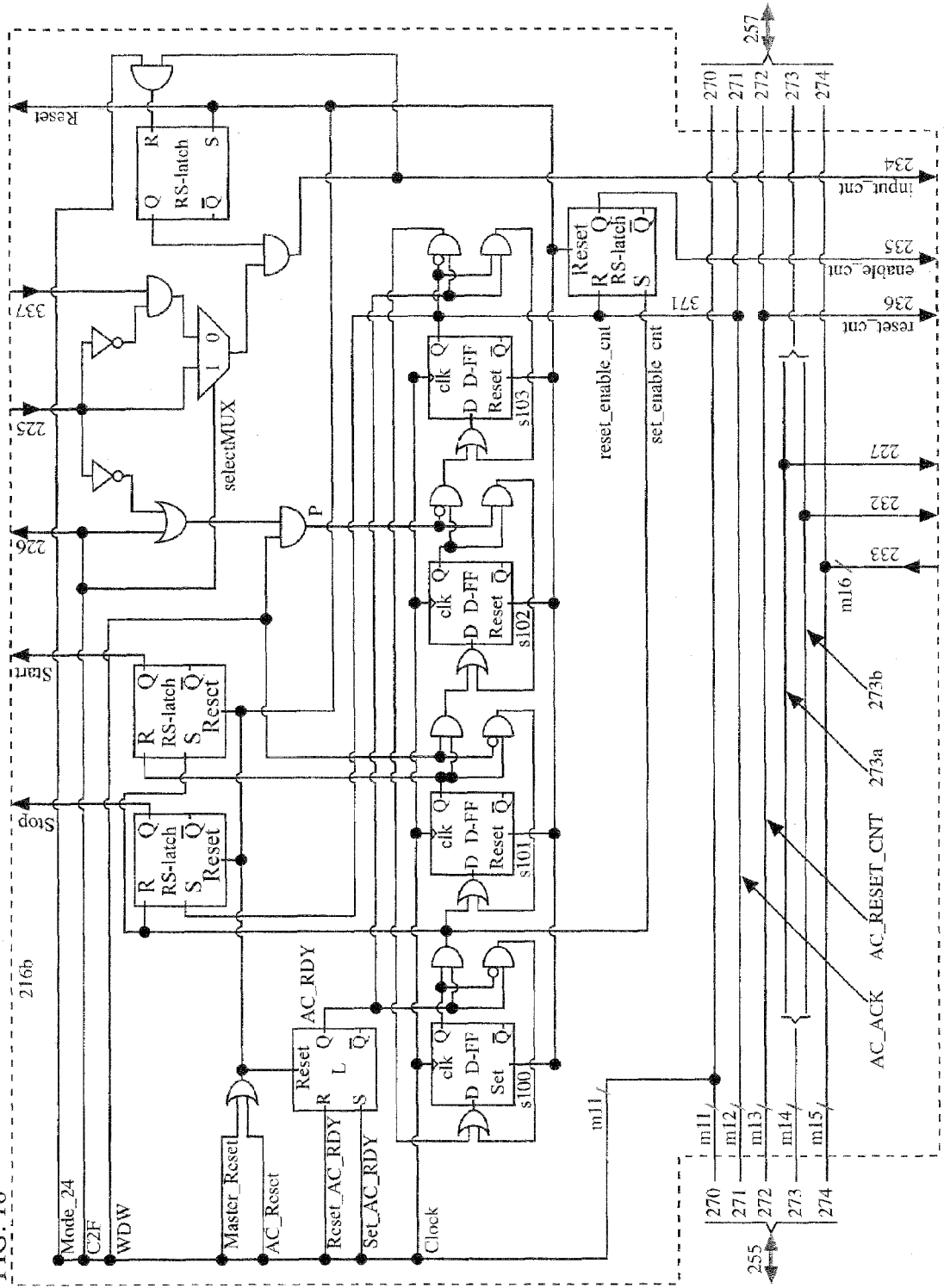
FIG. 18 is a schematic diagram of the digital controller block (216b).

Finally, the block 216b is internally composed of a set of Flip-Flops (FFs) and discrete logic gates as depicted in FIG. 18. This block accepts from the outside the command to reset the contents of the digital binary counter (via line 272) or the reset of its internal Finite-State-Machine (FSM) via one of the lines in the set of lines 270. The FSM is controlled by an external synchronous clock signal (as part of the set of lines 270) and performs a simple sequencing of the operation of the column-parallel A-to-D controller block 216a. First it waits for the internal line "AC_RDY" to be active (line 371 in FIG.

18), and when this occurs, the FSM activates the "Start" line for the block 216a, enabling the counter in block 214 via the line 235. During this phase of operations, any transition at the output of the comparator block 211 in block 216a, is propagated via the input line 225 to this block 216a, via the multiplexer M1 and the logic gate A1 to the digital binary counter input line 234, thereby inducing an increase in the counting of digital counter block 214.

When a specific time interval has elapsed, as indicated by the externally provided line WDW (standing for Window), part of the set of lines 270, the FSM will activate the "Stop" line at the block 216a, thus disabling any further counting (in block 216a) of pulses at the output of the comparator block 211.

The FSM can also control the digital binary counter block 214 in stopwatch counting mode, when the line C2F and MODE_24 are at the logic values 0 and 1 respectively. In this setting, the logic in block 216c will direct the output of the Ring-Oscillator block (237) via line 337 to the input of the digital binary counter 214. This clock signal will thus allow the counter to count freely until the first transition from Low-to-High logic values occurs at the output of the comparator in block 211. In order to capture the first and only transition of this kind, there is a feedback inside block 216c locking out any repeated transitions of the output of the comparator 211. In this mode of operation, the digital binary counter (214) will count only during a defined interval of time, effectively operating in stopwatch mode.

When either of these modes of operation, counter mode and stop-watch mode, have reached the time limit imposed by the WDW line, the FSM will activate its acknowledge line at the output of block 216a (line 271). An external controller (not shown in this document) will then issue a command for deactivating the "AC_RDY" internal line and proceed to extract the digital binary value of the counter (line 233) before proceeding to a difference row of the pixel-matrix. An alternative way through which the external controller can determine that all the column-parallel A-to-D blocks 216b have completed their conversion operation, before the window time interval has elapsed, is by inspecting all lines 371 that these 216b blocks activated as part of the data bus line 271. A possible detection strategy would be for this external controller to periodically poll all these lines in the set of lines 271 and detect when all them have been set to the logic value 1.

What is claimed is:

1. An analog-to-digital converter (ADC) apparatus for analog source signals of one polarity, comprising:
   one comparator (211), comprised of plural transistors (T2, T3, T4, T5 and T6);
   pass transistors (T1 and T10);
   a first block of digitally addressable voltage sources (213) to set a reference voltage (Vref) of the comparator (211);
   a second block of digitally addressable voltage sources (280) to set a potential to be applied to a cathode of a signal source;
   an asynchronous n-bit digital counter (214);
   a third block of digitally addressable voltage sources (215) to set a potential to be applied to an anode of the signal source;
   a digital control unit (216);
   a block (217) storing calibration data for an input capacitor (Cref) of the comparator (211); and
   a base-2 multiplier block (218),
   wherein the one comparator (211) is interconnected by the following branches or lines:
   a line (221) connecting an input analog signal (source signal) to a drain of a first of the pass transistors (T1),
   a line (224) connecting a source of the first pass transistors (T1) to a source of a second of the plural transistors (T3), and to the third block of digitally addressed voltage sources (215) to be connected to the anode of the signal source,
   a group of lines (282) connecting the digital control unit (216) to gates of the pass transistors in the second block of digitally addressable voltage sources (280) to set the potential to be applied to the cathode of the signal source through another line (281),
   a line (223) connecting the digital control unit (216) to a drain of a second of the pass transistors T10,
   a line (284) connecting the digital control unit (216) to a gate of the first pass transistor (T1),
   a line (283) connecting the digital control unit (216) to a gate of a first, second, and third of the plural transistors (T2, T3 and T4),
   a line (222) carrying a signal (Vref) from the first block of digitally addressed voltage sources (213) to a source of the first of the plural transistors (T2) of the comparator (211),
   a line (226) connecting the digital control unit (216) to a gate of the second pass transistor (T10),
   a line (225) connecting an output of the comparator (211) to the digital control unit (216) and a source of the second pass transistor (T10),
   a group of lines (227) connecting the digital control unit (216) to the gates of the pass transistors in the third block of digitally addressable voltage sources (215) to set the potential to be applied to the anode of the signal source,
   a group of lines (232) connecting the digital control unit (216) to the gates of the pass transistors in the first block of digitally addressable voltage sources (213) to set the signal (Vref) for the source of the first transistor (T2) inside the comparator (211),
   one or several lines (233) connecting an output of the asynchronous n-bit digital counter (214) to the digital control unit (216),
   a first line (236) connecting the digital control unit (216) to the asynchronous n-bit digital counter (214) to provide a "Reset" signal,
   a second line (235) connecting the digital control unit (216) to the asynchronous n-bit digital counter (214) to provide an "Enable" signal,
   a third line (234) connecting the digital control unit (216) to an input of the asynchronous n-bit digital counter (214) to provide said input of the asynchronous n-bit digital counter (214) with either an output signal (225) of the comparator (211), or an oscillating signal,
   one or several lines (228) connecting the digital control unit (216) to the block (217) storing the calibration data for the input capacitor (Cref) of the comparator (211),
   one or several other lines (229) connecting the digital control unit to the (216) to the base-2 multiplier block (218),
   one or several lines (230) connecting the block (217), storing the calibration data for the capacitor (Cref), to the base-2 multiplier block (218), and
   a group of lines (231) providing access to an output of the base-2 multiplier (218).

2. The block of circuitry comprising the analog-to-digital converter (ADC) apparatus of claim 1, and further comprising:
   an additional block of circuitry (300) comprised of two other pass transistors (T11 and T12), wherein a drain of a first of the two other pass transistors (T11) is connected to the line (221) connecting the input analog signal to the drain of the first of the pass transistors (T1), wherein a source of the first of the two other pass transistors (T11) is connected to yet another line (302), wherein a drain of a second of the two other pass transistors (T12) is connected to the another line (281) of said ADC, wherein a source of the second of the two other pass transistors (T12) is connected to still yet another line (303), and wherein a control line (301) is connected to gates of the two other pass transistors (T11 and T12).

3. A block of circuitry comprising:

a first and a second analog-to-digital converter (ADC) apparatus of claim 1, and further comprising:

an additional block of circuitry (304) comprised of three additional pass transistors (T11, T12, and T14), wherein the drain of a first of the three additional pass transistors (T11) is connected to the line (221), connecting the input analog signal to the drain of the first of the pass transistors (T1), of the first ADC, wherein the source of the first of the three additional pass transistors (T11) is connected to yet another line (302), wherein the drain of a second of the three additional pass transistors (T12) is connected to the another line (281) of the second ADC, wherein the source of a third of the three additional pass transistors (T14) is connected to the another line (281) of the first ADC, wherein the drain of the third of the three additional pass transistors (T14) is connected to the line (221), connecting the input analog signal to the drain of the first of the pass transistors (T1), of the second ADC, wherein source of the second of the three additional pass transistors (T12) is connected to still yet another line (303), and wherein a control line (301) is connected to the gates of the three additional pass transistors (T11, T12, and T14).

4. A method of analog to digital conversion using the ADC of claim 1, operating in a "charge-to-frequency" or "charge-subtraction" mode, in which the input capacitor Cref of the comparator (211) is used to subtract a set of charges from the signal source, and the asynchronous n-bit digital counter (214) records how many sets of charges are subtracted, the method comprising the following steps A through J:

A. Quantization operation begins with the digital control unit (216) turning ON transistor T1 via line 284 and T3 via line 283;

B. If/when the charge in the signal source is larger than the pre-loaded value into the Cref, there will be a transition at the output 225 of the comparator 211, which will increase the value in the digital counter 214, and will have the digital control unit turn T1 OFF, through the connecting line 284;

C. While T1 is turned OFF, T3 remains ON, and Cref is discharged through line 224 and the T7 transistor that is connected to Ground, and when this happens, there is another transition at the output 225 of the comparator 211;

D. The transition from "High" to "Low" at the output 225 of the comparator 211, triggers the digital control 216 to pre-charge the capacitor Cref by switching ON momentarily transistors T2 and T4 while transistors T3 is OFF;

E. Following this pre-charging of the Cref capacitor the digital control block 216 turns ON T1 via the line 284 and turns the transistor T3 ON via line 283 while switching OFF transistors T7, T2 and T4, thereby exposing the Cref capacitor of the comparator 211 block to a pixel column signal (line 221);

F. Steps C through E effectively "locally" reset the comparator 211, and finish a full cycle of counting a packet of charge with the "Charge-Subtraction" method;

G. When the charge in signal source is smaller than the value pre-loaded to the Cref capacitor, there will not be any more transitions at the output of the comparator 211, and T1 will not be switched OFF anymore;

H. Switch OFF signal source;

I. Transfer the base-2 binary value from the digital counter 214 to a circuitry external to the ADC; and J. Repeat steps A through I, for any further quantization processes of source signal.

5. A method of analog to digital conversion using the ADC of claim 1, operating in a "voltage-to-time" or "voltage extrapolation" mode, in which the input capacitor Cref of the comparator (211) is exposed to the source signal, and from its partial charging an extrapolation is made about the actual value of the source signal, the method comprising the following steps A through J:

A. Turn ON the T8 connected to the largest voltage for linear gain, and simultaneously turn ON one of the T7 transistors;

B. Simultaneously turn ON the source signal, start the digital counters 214, and start counting time. Time is counted by the digital counter 214, when the digital control unit connects to the input of said counter 214, the output (line 337) of a "ring oscillator" block 237, and at the same time disconnects the output 225 of the comparator 211 from the input of the digital counter 214;

C. When the digital control unit 216 detects a transition at the output 225 of the comparator 211, it stops the digital counter 214, which registered the time interval Tref that it took for the voltage V(t) across the capacitor Cref reached the reference voltage Vref, D. Is Tref (or equivalently Vref) too small
If YES, go to E,
If NO, go to I;

E. Turn ON the T8 connected to the immediately smaller voltage supply;

F. Repeat 2B, 2C and 2D until Tref (or equivalently Vref) is no longer too small;

G. If after quantizing the current with every single T8, Tref is still not in the ideal range, change Vref to a new value, and repeat steps 2A through 2G;

H. Switch OFF the signal source;

I. Transfer the base-2 binary value from the digital counter 114 and the Cref capacitor calibration data 217 into a "Base-2 Multiplier" 218, the product of the processing done at the "Base-2 Multiplier" 218 is then transferred to a circuitry external to the ADC; and J. Repeat steps A through D for any further quantization processes of source signal.

6. A method of signal (current or voltage) edge or pulse detection, using the ADC of claims 1, operating in a "voltage-to-time" or "voltage extrapolation" mode, in which the input capacitor Cref of the comparator (211) is exposed to the source signal, and from its partial charging a signal (current or voltage) edge or pulse is detected for timing purposes, the method comprising the following steps A through H:

A. The digital counter 214 is reset to zero;

B. Turn ON the T8 connected to the voltage supply with which the signal source will have a non-linear behavior, and simultaneously turn ON one of the T7 transistors;

C. Simultaneously do:
Turn ON signal source,
Trigger external excitation, and
Start the digital counter 214 to count time;
D. When the digital control unit 216 detects a transition at the output 225 of the comparator 211, it stops the digital counter 214, the digital counter 214 registers the time interval it took between the triggering of the external excitation and the detection of an edge/pulse by the ADC;
E. A pre-defined time interval sets the allowed time to "wait" for response to the external excitation, and if at the end of that time no edge/pulse has been detected, then the digital control unit 216 orders the counter to stop;
F. Turn OFF signal source;
G. Transfer the base-2 binary value of the digital counter 214 to a circuitry external to the ADC; and
H. Repeat steps A through G for any further quantization processes of source signal.

7. A method of collecting, converting and storing energy, using the block of circuitry of claim 2, in which the photo-current generated by pixels in an imaging matrix, is directed away from A-to-D conversion circuitry into other circuitry, suitable for voltage conversion and/or energy storage, the mode of operation comprising the following steps A through C:
   A. In block 239, turn OFF transistor T1, all transistors T8 of block 280, and all transistors T7 of block 215 transistor T1, all transistors T8 of block 280, and all transistors T7 of block 215 all remaining "OFF" while the system operates as a solar cell;
   B. Turning "ON" all row-select transistors (RS) transistors in a pixel matrix (240); and
   C. Turning "ON" transistor T11 and transistor T12 in block 300, which will remain "ON" while the system operates as a solar cell, thus allowing photo-current to flow through lines 302, 303, 306, 307, into block 305.

8. A method of collecting, converting and storing energy, using the block of circuitry of claim 2, in which the photo-current generated by pixels in an imaging matrix, is directed away from A-to-D conversion circuitry into other circuitry, suitable for voltage conversion and/or energy storage, the mode of operation comprising the following steps A through C:
   A. In block 239, turn OFF transistor T1, all transistors T8 of block 280, all transistors T7 of block 215, they all remain "OFF" while the system operates as a solar cell;
   B. Turning "ON" all row-select transistors (RS) transistors in a pixel matrix (240); and
   C. Turning "ON" transistor T11, T12 and transistor T14 in block 304, which will remain "ON" while the system operates as a solar cell, thus allowing photo-current to flow through lines 302, 303, 306, 307, into block 305.

9. A method of analog to digital conversion using the ADC of claim 2, in which the mode of operation can be software-configured in real-time, between the mode of:
   I) operating in a "voltage-to-time" or "voltage extrapolation" mode, in which the input capacitor Cref of the comparator (211) is exposed to the source signal, and from its partial charging an extrapolation is made about the actual value of the source signal, the method comprising the following steps A through J:
   A. Turn ON the T8 connected to the largest voltage for linear gain, and simultaneously turn ON one of the T7 transistors;
   B. Simultaneously turn ON the source signal, start the digital counters 214, and start counting time, time is counted by the digital counter 214, when the digital control unit connects to the input of said counter 214, the output (line 337) of a "ring oscillator" block 237, and at the same time disconnects the output 225 of the comparator 211 from the input of the digital counter 214;
   C. When the digital control unit 216 detects a transition at the output 225 of the comparator 211, it stops the digital counter 214, which registered the time interval Tref that it took for the voltage V(t) across the capacitor Cref reached the reference voltage Vref;
   D. Is Tref (or equivalently Vref) too small
   If YES, go to E,
   If NO, go to I;
   E. Turn ON the T8 connected to the immediately smaller voltage supply;
   F. Repeat 2B, 2C and 2D until Tref (or equivalently Vref) is no longer too small;
   G. If after quantizing the current with every single T8, Tref is still not in the ideal range, change Vref to a new value, and repeat steps 2A through 2G;
   H. Switch OFF the signal source;
   I. Transfer the base-2 binary value from the digital counter 114 and the Cref capacitor calibration data 217 into a "Base-2 Multiplier" 218. The product of the processing done at the "Base-2 Multiplier" 218 is then transferred to a circuitry external to the ADC; and
   J. Repeat steps A through D for any further quantization processes of source signal;
   II) operating in a "voltage-to-time" or "voltage extrapolation" mode, in which the input capacitor Cref of the comparator (211) is exposed to the source signal, and from its partial charging a signal (current or voltage) edge or pulse is detected for timing purposes, the method comprising the following steps A through H:
   A. The digital counter 214 is reset to zero;
   B. Turn ON the T8 connected to the voltage supply with which the signal source will have a non-linear behavior, and simultaneously turn ON one of the T7 transistors;
   C. Simultaneously do:
   Turn ON signal source,
   Trigger external excitation, and
   Start the digital counter 214 to count time;
   D. When the digital control unit 216 detects a transition at the output 225 of the comparator 211, it stops the digital counter 214, the digital counter 214 registers the time interval it took between the triggering of the external excitation and the detection of an edge/pulse by the ADC;
   E. A pre-defined time interval sets the allowed time to "wait" for response to the external excitation, and if at the end of that time no edge/pulse has been detected, then the digital control unit 216 orders the counter to stop;
   F. Turn OFF signal source;
   G. Transfer the base-2 binary value of the digital counter 214 to a circuitry external to the ADC; and
   H. Repeat steps A through G for any further quantization processes of source signal;
   III) collecting, converting and storing energy in which the photo-current generated by pixels in an imaging matrix, is directed away from A-to-D conversion circuitry into other circuitry, suitable for voltage conversion and/or energy storage, the mode of operation comprising the following steps A through C:
   A. In block 239, turn OFF transistor T1, all transistors T8 of block 280, all transistors T7 of block 215, they all remain "OFF" while the system operates as a solar cell;
   B. Turning "ON" all row-select transistors (RS) transistors in a pixel matrix (240);
   C. Turning "ON" transistor T11 and transistor T12 in block 300, which will remain "ON" while the system operates as a solar cell, thus allowing photo-current to flow through lines 302, 303, 306, 307, into block 305; and IV) collecting, converting and storing energy, in which the photo-current generated by the pixels in the imaging matrix, is directed away from A-to-D conversion circuitry into other circuitry, suitable for voltage conversion and/or energy storage, the mode of operation comprising the following steps A through C:

A. In block 239, turn OFF transistor T1, all transistors T8 of block 280, all transistors T7 of block 215, they all remain "OFF" while the system operates as a solar cell;

B. Turning "ON" all row-select transistors (RS) transistors in the pixel matrix (240); and C. Turning "ON" transistor T11, T12 and transistor T14 in block 304, which will remain "ON" while the system operates as a solar cell, thus allowing photo-current to flow through lines 302, 303, 306, 307, into block 305.

10. An image sensing system, comprising:
a CMOS image sensor comprised of a pixel matrix (240) in which each pixel comprises an avalanche photo-diode (APD) and a Row-Select (RS) transistor;
a column circuitry (243, 244) comprising top and bottom sets of ADCs as defined in claim 1, each ADC being connected to a data line in said pixel matrix;
a photo-current power conversion unit (305);
a matrix controller (241); and
a logic unit comprised of a run length encoder (242), a table (245) with Cref calibration data for ADCs of blocks (243, 244), at least one base-2 multiplier (246), a timing table (247) and a number "n" of bit planes (248a to 248n).

11. The image sensing system of claim 10, wherein a reset of the pixels in the pixel matrix (240) is performed through forward biasing of the photo-diode inside said pixels, by causing the digital control block (216) to select an appropriate transistor (T8) inside the second block of digitally addressable voltage sources (280), to apply a voltage pulse to the another line (281), with suitable magnitude, polarity and duration, while the Row-Select transistors of said pixels are turned OFF.

12. A method of collecting, converting and storing energy, using the block of circuitry of claim 3, in which the photo-current generated by the pixels in an imaging matrix, is directed away from A-to-D conversion circuitry into other circuitry, suitable for voltage conversion and/or energy storage, the mode of operation comprising the following steps A through C:

A. In block 239, turn OFF transistor T1, all transistors T8 of block 280, all transistors T7 of block 215, they all remain "OFF" while the system operates as a solar cell;

B. Turning "ON" all row-select transistors (RS) transistors in the pixel matrix 240; and C. Turning "ON" transistor T11 and transistor T12 in block 300, which will remain "ON" while the system operates as a solar cell, thus allowing photo-current to flow through lines 302, 303, 306, 307, into block 305.

13. A method of collecting, converting and storing energy, using the block of circuitry of claim 3, in which the photo-current generated by the pixels in an imaging matrix, is directed away from A-to-D conversion circuitry into other circuitry, suitable for voltage conversion and/or energy storage, the mode of operation comprising the following steps A through C:

A. In block 239, turn OFF transistor T1, all transistors T8 of block 280, all transistors T7 of block 215, they all remain "OFF" while the system operates as a solar cell;

B. Turning "ON" all row-select transistors (RS) transistors in the pixel matrix 240; and C. Turning "ON" transistor T11, T12 and transistor T14 in block 304, which will remain "ON" while the system operates as a solar cell, thus allowing photo-current to flow through lines 302, 303, 306, 307, into block 305.

14. The block of circuitry comprising the analog-to-digital converter (ADC) apparatus of claim 1, wherein the oscillating signal is a ring oscillator (237).

15. An analog-to-digital converter (ADC) apparatus for analog source signals of one polarity, comprising:
one comparator (211) comprised of a plurality of transistors (T2, T3, T4, T5 and T6);
pass transistors (T1 and T10);
a first block of digitally addressable voltage sources (213) to set a reference voltage (Vref) of the comparator (211);
a second block of digitally addressable voltage sources (280) setting a potential to be applied to a cathode of a signal source;
an asynchronous n-bit digital counter (214);
a third block of digitally addressable voltage sources (215) to set a potential to be applied to an anode of the signal source;
a digital control unit (216);
a block (217) storing the calibration data for an input capacitor (Cref) of the comparator (211);
a base-2 multiplier block (218);
a line (221) connecting an input analog signal (source signal) to a drain of a first of the pass transistors (T1);
a line (224) connecting a source of the first pass transistor (T1) to a source of a second of the plurality transistors (T3), and to the third block of digitally addressable voltage sources (215) to be connected to the anode of the signal source;
a group of lines (282) connecting the digital control unit (216) to gates of the pass transistors in the second block of digitally addressable voltage sources (280) to set the potential to be applied, through another line (281), to the cathode of the signal source;
a line (223) connecting the digital control unit (216) to a drain of a second of the pass transistors (T10);
a line (284) connecting the digital control unit (216) to a gate of the first pass transistor (T1);
a line (283) connecting the digital control unit (216) to a gate of a first, a third, and the second of the plurality of transistors (T2, T3 and T4);
a line (222) carrying a signal Vref) from the first block of digitally addressable voltage sources (213) to a source of the first of the plurality of transistors (T2) of the comparator (211);
a line (226) connecting the digital control unit (216) to a gate of the second pass transistor (T10);
a line (225) connecting an output of the comparator (211) to the digital control unit (216) and a source of the second pass transistor (T10);
a group of lines (227) connecting the digital control unit (216) to the gates of the pass transistors in the third block of digitally addressable voltage sources (215) to set the potential to be applied to the anode of the signal source;
a group of lines (232) connecting the digital control unit (216) to the gates of the pass transistors in the first block of digitally addressable voltage sources (213) to set the signal (Vref) for the source of the first of the plurality of transistors (T2) inside the comparator (211);
at least one line (233) connecting an output of the asynchronous n-bit digital counter (214) to the digital control unit (216);

a first line (236) connecting the digital control unit (216) to the asynchronous n-bit digital counter (214), to provide a "Reset" signal;

a second line (235) connecting the digital control unit (216) to the asynchronous n-bit digital counter (214), to provide an "Enable" signal;

a third line (234) connecting the digital control unit (216) to an input of the asynchronous n-bit digital counter (214), to provide said input of the asynchronous n-bit digital counter (214) with either an output signal (225) of the comparator (211), or an oscillating signal;

at least one line (228) connecting the digital control unit (216) to the block (217) storing the calibration data for the input capacitor (Cref) of the comparator (211);

at least one other line (229) connecting the digital control unit to the (216) to the base-2 multiplier (218);

at least one line (230) connecting the block (217) storing the calibration data for the input capacitor (Cref) of the comparator (211), to the base-2 multiplier (218); and a group of lines (231) providing access to the output of the base-2 multiplier (218).

16. The block of circuitry comprising the analog-to-digital converter (ADC) apparatus of claim 15, wherein the oscillating signal is a ring oscillator (237).

\* \* \* \* \*